United States Patent
Tang

(10) Patent No.: US 7,239,116 B2
(45) Date of Patent: Jul. 3, 2007

(54) FINE RESOLUTION PULSE WIDTH MODULATION PULSE GENERATOR FOR USE IN A MULTIPHASE PULSE WIDTH MODULATED VOLTAGE REGULATOR

(75) Inventor: Benjamin Tang, Rancho Palos Verdes, CA (US)

(73) Assignee: Primarion, Inc., Torrance, CA (US)

( * ) Notice: Subject to any disclaimer, the term of this patent is extended or adjusted under 35 U.S.C. 154(b) by 0 days.

(21) Appl. No.: 11/112,707

(22) Filed: Apr. 23, 2005

(65) Prior Publication Data

US 2006/0132110 A1    Jun. 22, 2006

Related U.S. Application Data

(60) Provisional application No. 60/638,174, filed on Dec. 21, 2004.

(51) Int. Cl.
*G05F 1/40*     (2006.01)
(52) U.S. Cl. ..................................... 323/282; 323/266
(58) Field of Classification Search ........ 323/282–285, 323/266, 268, 271–279, 234; 363/16–20, 363/21.1, 21.2, 97, 131
See application file for complete search history.

(56) References Cited

U.S. PATENT DOCUMENTS

| | | | | |
|---|---|---|---|---|
| 6,157,182 A | * | 12/2000 | Tanaka et al. | 323/284 |
| 6,819,190 B2 | * | 11/2004 | Pearce et al. | 331/57 |
| 7,042,202 B2 | * | 5/2006 | Sutardja et al. | 323/283 |
| 7,057,379 B2 | * | 6/2006 | Chapuis | 323/283 |

* cited by examiner

*Primary Examiner*—Rajnikant B. Patel
(74) *Attorney, Agent, or Firm*—T. E. Galanthay

(57) ABSTRACT

Disclosed is a fine resolution pulse width generator for use in a multiphase pulse width modulated voltage regulator. The fine pulse width is generated by first generating a pulse with a coarse pulse width and one or more delayed replicas thereof. Then, digitally controlled analog interpolators are used to generate the fine resolution pulse width pulse by interpolating among the coarse pulse width pulses. Both single edge and double edge modulation embodiments are disclosed providing interpolation of just the trailing edges of the coarse pulses or both the leading and trailing edges, respectively. The disclosed fine resolution pulse generator uses counters, thermometer encoders and analog interpolators to achieve interpolation accurately by insuring that each interpolation step corresponds to an equal weight. Accuracy of the interpolation is defined by the linearity (i.e. how well the interpolation fits a best fit straight line) and monotonicity (i.e. how each step contributes a positive weight to the total).

38 Claims, 9 Drawing Sheets

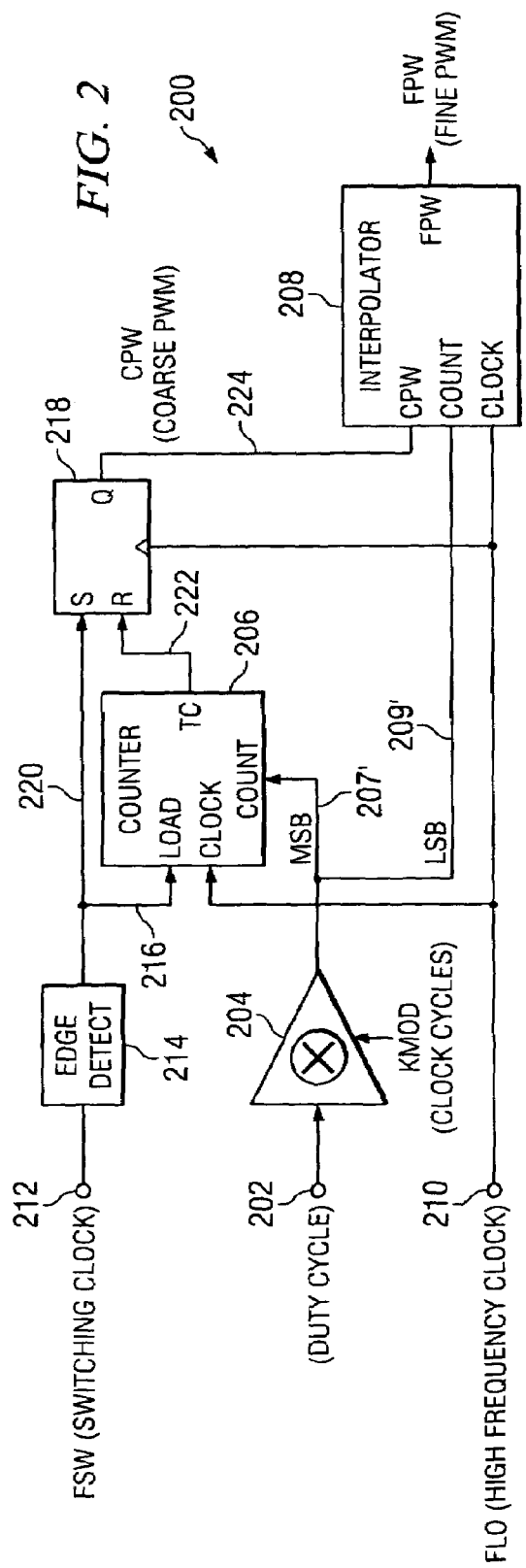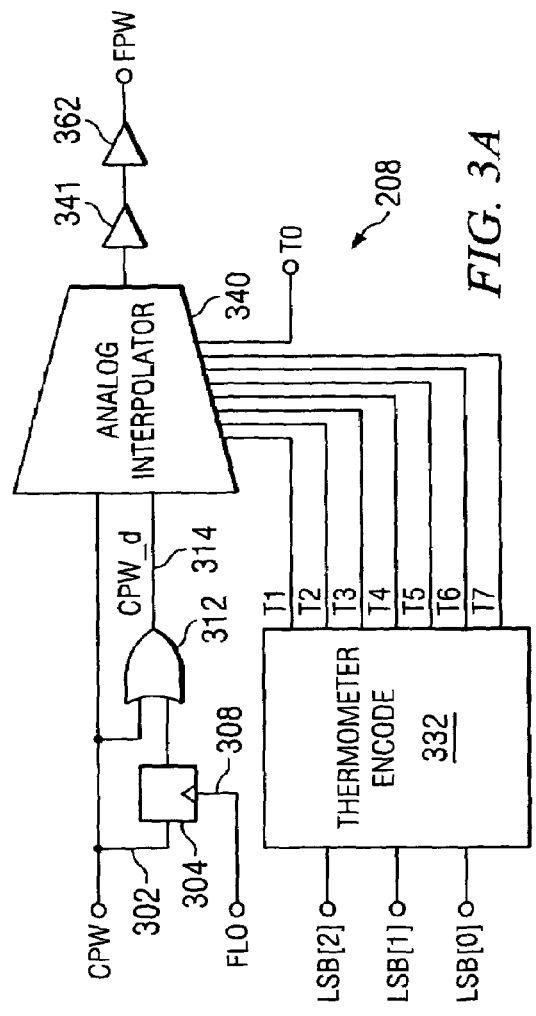

| DECIMAL | BINARY | | | THERMOMETER | | | | | | |
|---|---|---|---|---|---|---|---|---|---|---|
| | B[4] | B[3] | B[2] | $T_7$ | $T_6$ | $T_5$ | $T_4$ | $T_3$ | $T_2$ | $T_1$ |
| 0 | 0 | 0 | 0 | 0 | 0 | 0 | 0 | 0 | 0 | 0 |
| 1 | 0 | 0 | 1 | 0 | 0 | 0 | 0 | 0 | 0 | 1 |
| 2 | 0 | 1 | 0 | 0 | 0 | 0 | 0 | 0 | 1 | 1 |
| 3 | 0 | 1 | 1 | 0 | 0 | 0 | 0 | 1 | 1 | 1 |
| 4 | 1 | 0 | 0 | 0 | 0 | 0 | 1 | 1 | 1 | 1 |
| 5 | 1 | 0 | 1 | 0 | 0 | 1 | 1 | 1 | 1 | 1 |
| 6 | 1 | 1 | 0 | 0 | 1 | 1 | 1 | 1 | 1 | 1 |
| 7 | 1 | 1 | 1 | 1 | 1 | 1 | 1 | 1 | 1 | 1 |
*FIG. 4A*
| B[1] | B[0] | | $T_{OZ}$ | $T_{OY}$ | $T_{OX}$ |
|---|---|---|---|---|---|
| 0 | 0 | | 0 | 0 | 0 |
| 0 | 1 | | 0 | 0 | 1 |
| 1 | 0 | | 0 | 1 | 1 |
| 1 | 1 | | 1 | 1 | 1 |
*FIG. 4B*
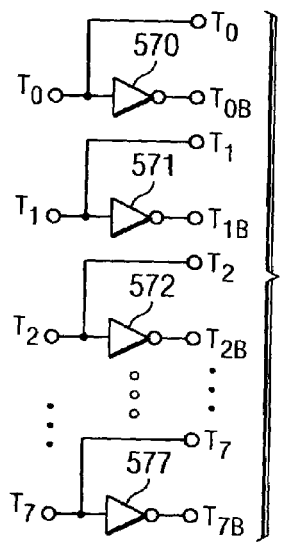
*FIG. 5B*
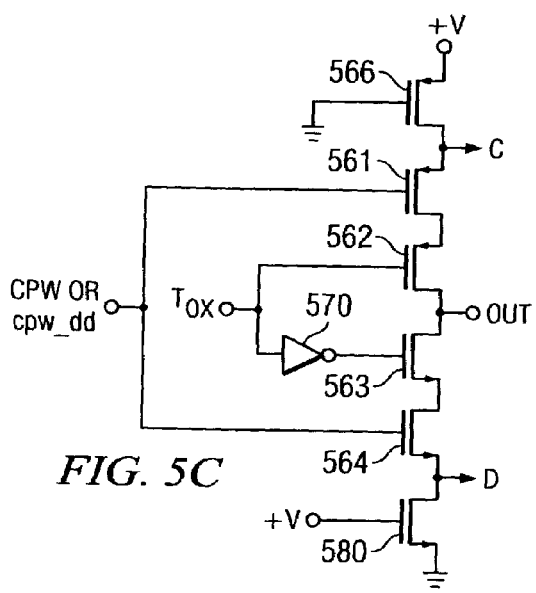
*FIG. 5C*
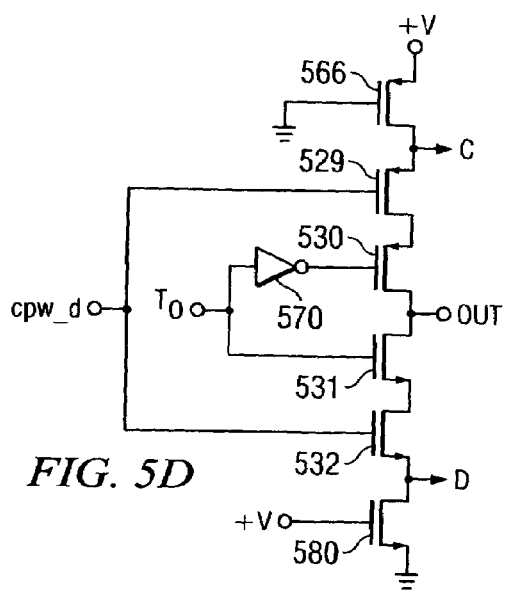
*FIG. 5D*

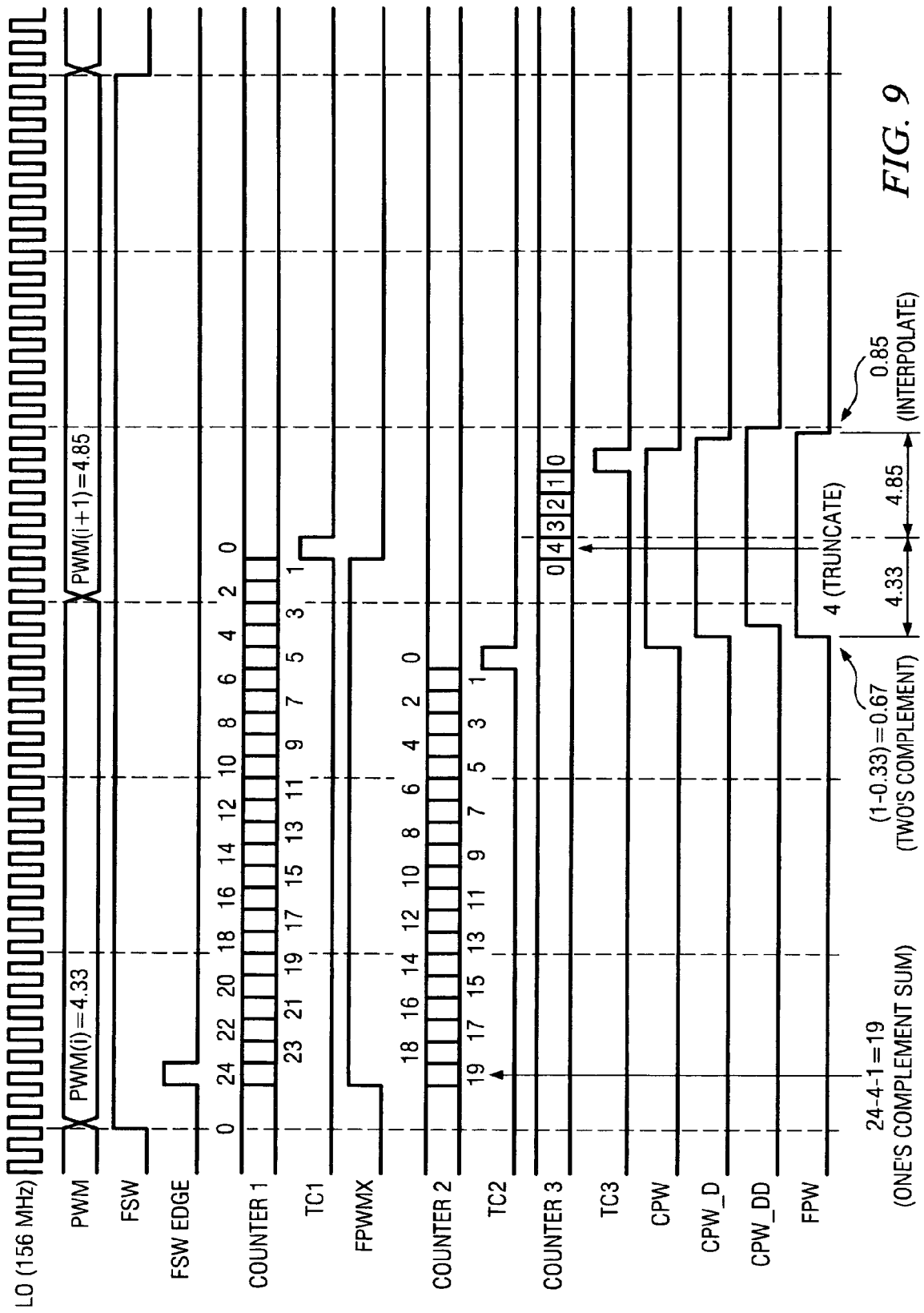

FINE RESOLUTION PULSE WIDTH MODULATION PULSE GENERATOR FOR USE IN A MULTIPHASE PULSE WIDTH MODULATED VOLTAGE REGULATOR

CROSS REFERENCES TO RELATED PATENT APPLICATIONS AND PATENTS

This application includes subject matter that is related to and claims priority from the following patent applications, commonly assigned to the assignee of the present application, that are hereby incorporated herein by reference:

1. SYSTEM AND METHOD FOR HIGHLY PHASED POWER REGULATION, Ser. No. 10/112,738 filed Apr. 1, 2002, inventors: Duffy, et al, now U.S. Pat. No. 6,563,294.
2. SYSTEM, DEVICE AND METHOD FOR PROVIDING VOLTAGE REGULATION TO A MICROELECTRONIC DEVICE, Ser. No. 10/103,980, filed Mar. 22, 2002, inventors: Duffy et al.
3. SYSTEM AND METHOD FOR CURRENT HANDLING IN A DIGITALLY CONTROLLED POWER CONVERTER, Ser. No. 10/237,903, filed Sep. 9, 2002, inventors: Duffy et al, now U.S. Pat. No. 6,795,009.
4. SYSTEM AND METHOD FOR HIGHLY PHASED POWER REGULATION USING ADAPTIVE COMPENSATION CONTROL, Ser. No. 10/109,801, filed Oct. 15, 2001, inventors: Goodfellow et al.
5. DIGITAL CALIBRATION WITH LOSSLESS SENSING IN A MULTIPHASE SWITCHED POWER CONVERTER, Ser. No. 10/884,840, filed Jul. 2, 2004, inventors: Southwell et al.
6. MULTI-THRESHOLD MULTI-GAIN ACTIVE TRANSIENT RESPONSE CIRCUIT AND METHOD FOR DIGITAL MULTIPHASE PULSE WIDTH MODULATED REGULATORS, Ser. No. 10/938,031, filed Sep. 10, 2004, inventors Tang et al.
7. ACTIVE TRANSIENT RESPONSE CIRCUITS, SYSTEM AND METHOD FOR DIGITAL MULTIPHASE PULSE WIDTH MODULATED REGULATORS, Ser. No. 60/638,174, filed Dec. 21, 2004, inventors Tang et al.

BACKGROUND OF THE INVENTION

1. Technical Field of Invention

The present invention relates, generally, to power regulation systems and, in particular, to providing precisely regulated power to a microelectronic device such as a microprocessor. Improved power regulation is accomplished with a fine resolution pulse width generator.

2. Background of the Invention

Regulated power supplies or voltage regulators are typically required to provide the voltage and current supply to microelectronic devices. The regulator is designed to deliver power from a primary source to an electrical load at the specified current, voltage, and power efficiency. Switching power converters (SPC) also referred to as Buck regulators are commonly used voltage regulators due to their high efficiency, high current capability, and topology flexibility. In addition, they can be designed to provide very precise voltage and current characteristics required by devices such as microprocessors, microcontrollers, memory devices, and the like.

Power requirements for emerging leading edge technology microprocessors have become very difficult to satisfy. As the speed and integration of microprocessors increases, the demands on the power regulation system increase. In particular, as gate counts increase, the power regulation current demand increases, the operating voltage decreases and transient events (e.g. relatively large voltage spikes or droops at the load) typically increase in both magnitude and frequency. Some emerging microprocessors are expected to run on less than 1.3 volts and more than 100 amperes.

SPC's utilizing step-down multi-phase Buck converters have been the preferred topology to meet the low voltage and high current requirements of microprocessors. With the advent of increasingly complex power regulation topologies, digital techniques for power converter control, specifically in multiphase designs, can improve precision and reduce the system's total parts count while also supporting multiple applications in the same power system through digitally programmable feedback control.

However, one of the difficulties in implementing digital multiphase buck converters is in the generation of precise width pulses to control the power switch. Since the width of the pulse has a direct impact on the voltage at the load, it is a key performance limiter if the system is unable to generate a pulse width with the desired precision.

Analog controllers typically use a precise sawtooth generator and a comparator to determine how wide a pulse to generate. The compensator or loop filter in the controller senses the voltage at the load and generates a voltage corresponding to the desired pulse width. The beginning of the output pulse is lined up to the beginning of the sawtooth waveform each period. The comparator compares the sawtooth generator with the compensator output to determine when the end of the output pulse should occur.

In a digital controller, the voltage (or current) sensed at the load is digitized using an analog to digital converter. Such a previously disclosed digital multiphase buck converter will be described in greater detail in connection with FIG. 1. Briefly, a target voltage is computed based on either a preset requirement or the user inputs, such as the voltage identification (VID) control word. The difference between the sensed voltage and target voltage is the error voltage, which is applied to a digital compensator or loop filter. The compensator transfer function is computed in such a way as to provide stable closed loop operation of the regulator, while maximizing the performance such as bandwidth of the loop. The compensator adjusts the width of the output pulse, increasing or decreasing the load voltage to drive the error voltage to zero, thus regulating the voltage at the load.

The digital compensator output is a representation of the desired pulse width. This output is scaled (i.e. multiplied) by a multiplier constant to generate a value that is used by the pulse width modulation generator (PWM) to generate a pulse of the desired width for that cycle. The pulse width modulation generator (PWM) typically uses a counter to generate a desired pulse width. The counter runs off a higher frequency clock such that the output pulse widths are integral multiples of the high frequency period (or half period if both edges of the clock are used by the counter). Since the width of the pulse generated in this manner is discrete, there is a quantization error associated with each pulse width.

Digital controllers attempt to reduce this quantization error through various techniques. One such technique, for example, is to simply run the counter clock at a higher frequency so that the discrete steps required are smaller. This technique however is limited when the technology will not support a higher clock frequency. In addition, a higher frequency counter would require an increase in power dissipation in order to support the higher clock frequency. By way of further example, another technique is to use a finer resolution delay generator, such as a chain of inverters.

This technique is primarily limited by the inability to control the delay in this fine resolution delay generator, so that the controller is not able to generate the desired pulse width with high precision.

Accordingly, improved techniques for precisely controlling the width of pulses generated by pulse width modulators (PWM) in digital multiphase controllers are needed. In particular, techniques that improve the accuracy and reduce the effects of quantization in digital pulse generators are desired.

SUMMARY OF THE INVENTION

The present invention overcomes the problems outlined above and provides an improved system, device and method for pulse width generation in a digital multiphase regulator. In particular, the present invention provides for high resolution and high precision pulse width control in digital pulse width generators, allowing improved performance in digital multiphase voltage regulators.

In accordance with the disclosed embodiments of the invention, single edge or trailing edge modulation is disclosed. As will become more apparent during a more detailed discussion of the invention, FIG. 8 shows exemplary waveforms of the desired functionality of a pulse width generator in a digital multiphase regulator controller. For each switching frequency cycle (Fsw), the digital controller samples the load voltage, obtains the error voltage, and generates the appropriate pulse width for that cycle to suppress the error. The digital compensator output is a binary number that is representative of the desired duty cycle, which is normalized through a multiplier to represent the number of clock cycles from a high frequency clock (Flo).

In the case of single edge modulation, the leading edge is always fixed relative to Fsw, while the trailing edge is modulated according to the digital input to the pulse width modulator. In this embodiment, the exemplary desired pulse width of the first pulse width modulated pulse is 4.33 clock cycles, and the desired pulse width of the second pulse width modulated pulse is 4.85 clock cycles. In accordance with this one embodiment of the invention, first the coarse pulse widths are generated and then interpolation is used to provide the precise fine pulse width that is the final output of the PWM generator. In the illustrated example, the PWM generator uses a programmable counter to generate the coarse pulse widths of 4 cycles (CPW), 4.5 cycles (CPW_D), and 5 cycles (CPW_DD), (each delay being precisely ½ switching frequency cycle) and then uses interpolation between these coarse pulse widths to obtain the desired fine pulse width (FPW).

In accordance with an embodiment of the invention, the digital pulse width word is truncated, such that only the most significant bits (referred to herein as MSBs) corresponding to integral clock cycles are sent to a counter, as will be further understood during the more detailed discussion of FIG. 2. When an edge on switching clock pulse Fsw is detected, the counter is loaded with this value and an SR latch is set. In accordance with one aspect of the invention, the counter is a down counter which generates a terminal count (TC) when it reaches 1 and then stops at 0. The TC is used to reset the SR latch and the output of the latch is the coarse pulse width (CPW). Note that the SR latch can be a traditional asynchronous SR latch, or can be synchronized to the clock signal. In either case the CPW will have the desired width.

In accordance with the invention, the fine pulse width is generated with the use of an interpolator. As will become apparent in the more detailed discussion of FIGS. 3, 6 and 5A, the interpolator is an analog interpolator. It receives the least significant bits (referred to herein as LSBs) from the duty cycle and also coarse pulse widths, and is configured to generate the final fine pulse width by interpolating among the trailing edges (in the case of single edge modulation) of the coarse pulse width and delayed replicas of the coarse pulse width CPW. The delayed replicas of CPW are obtained by delaying the CPW waveform through a flip-flop. Inverting the clock allows a half clock period delay to be obtained. The leading edge is kept from being delayed by simply OR-ing the flip-flop outputs with CPW.

In accordance with the exemplary embodiment of the invention, the analog interpolator structure is simply a voltage interpolator, where the output is a voltage interpolation between two inputs. The subsequent output waveform thus has a pulse width that is a weighted sum of the waveforms that would otherwise be obtained if the interpolators were fully weighted towards each of the other inputs. In this manner, the zero crossing and thus the pulse width can be moved in finer steps.

As will become more apparent in the more detailed discussion of FIG. 5A, which shows the details of the digitally controlled analog interpolator structure, the interpolator receives two inputs, each of which correspond to a coarse pulse width, for example 4 cycles wide and 4.5 cycles wide. The interpolation weight is set by the control bits (also referred to as the least significant bits (LSB's), numbered T0-7 and their complements, numbered T0$b$-7$b$. The control bit and its complement control two legs of the interpolator, one of which corresponds to one of the inputs and is enabled and the other which corresponds to the other input and is disabled. Note that by "leg" is meant a series connected set of transistors. Each control bit and its complement thus controls one of eight equally weighted legs. The interpolator is thus capable of generating an output which interpolates between the two inputs in ⅛ steps.

In accordance with the disclosed embodiments of the invention, it is noted that the key to performing interpolation accurately is to insure that each interpolation step corresponds to an equal weight. This is defined by the linearity (i.e how well the interpolation fits a best fit straight line) and monotonicity (i.e. each step contributes a positive weight to the total). The interpolator structure of FIGS. 3A and 3B along with the analog interpolator structure of FIG. 5A illustrates several techniques to minimize the interpolation error.

In accordance with the disclosed embodiments of the invention, it is a feature of the invention that the fine interpolator is thermometer coded, so that each step is obtained simply by adding one additional leg, i.e. one series connected circuit, as opposed to switching multiple legs on and off as in a binary weighted scheme.

It is a feature of the present invention that the fine interpolator is used in an alternating manner, such that (by way of example) when it is used to interpolate from 4 to 4.5 cycles, and then from 4.5 to 5.0 cycles, the same input is used for the 4.5 cycle wide pulse. This insures that as the interpolator switches from, <4.5 to >4.5, it requires few legs to be switched. Similarly, as the interpolator switches from <5.0 to >5.0, it can alternate between interpolating between 4.5 and 5.0, and between 5.0 and 5.5, such that the same input can be used for 5.0 and few legs would have to switch as it transitions from <5.0 to >5.0. In accordance with a specific aspect of the invention, the input switching is accomplished by using a 2:1 multiplexer for selecting the clock pulse width (cpw) and the doubly delayed pulse width (CPW_dd), while the other input is always the delayed pulse width (CPW_d).

In accordance with the exemplary disclosed embodiment of the invention, the interpolation is broken down into a plurality of stages, e.g. 4 separate stages, each of which is thermometer coded except for the least significant of the least significant bits (LSBs). This allows a common thermometer encoder to be used for the more significant least significant bits (LSBs), and a simple encoder for the least significant LSBs. As the interpolator steps are increased, the least significant LSB leg in each stage is activated, then rather than activate all 4, the common thermometer code is incremented, turning on 4 legs. Again, this insures that as the interpolation weight is changed to the next step, the number of internal stages being switched is minimized.

It is another feature of the invention that the thermometer encoder and the encoder for the least significant LSB's (fpwm[1] and fpwm[0]) are easily modified to accommodate the alternating input scheme described above, simply by using the most significant LSB (fpwm[5]) to select the CPW or CPW_dd input, and also using fpwm[5] to invert all the other bits to generate the symmetric thermometer code.

It is a still further feature of the invention that the analog interpolation is performed in four adjacent stages and the inputs to adjacent stages of the digitally controlled analog interpolator are inverted and slightly delayed. This tends to smooth out the interpolation and improve the linearity.

It is still another feature of this invention that the inputs to adjacent stages of the digitally controlled analog interpolator are of opposite polarity. This tends to equalize the rising edge interpolation (particularly in double edge modulation) and falling edge interpolation, preserving waveform symmetry. If equal polarity were used on all stages, there would be slight differences in rising edge and falling edge interpolation, thus degrading the linearity.

It is a still further feature of the invention that a differential to single ended amplifier is used at the output of the analog interpolator to recombine the signals of the two polarities.

Another feature of the invention is that a resistive current limiter is used in the analog interpolator. This limits the rise and falling transition times so that interpolation can be done more effectively. In accordance with the invention, the resistive current limiter is shared by all stages. Since the stages are slightly delayed relative to each other, this tends to smooth out the transitions more effectively than separate resistive current limiters.

Still another feature of the invention is that it is easily extendable to smaller and larger fine interpolators and more or fewer analog interpolation stages to obtain the desired fine interpolation resolution.

In accordance with another embodiment of the invention, the disclosed high linearity pulse width interpolator is also extendable to a double edge modulation PWM system. In a double edge modulation system, there is a digital pulse width word corresponding to the leading edge position and a separate digital pulse width word corresponding to the trailing edge position. Each digital pulse width word thus corresponds to a portion of the pulse width and it is the sum of these two words that generates the total pulse width. This total pulse width occurs over two switching frequency cycles and takes the place of two pulses that occur over two switching frequency cycles in single edge modulation. A double edge modulation system is an over sampled system, where two computations are being performed corresponding to each switching frequency period.

The double edge modulated embodiment of the invention will be better understood in the detailed discussion of the exemplary discussion of the waveforms depicted in FIG. 9. Briefly, for each half of the switching frequency cycle, the controller samples the load voltage, obtains the error voltage, and generates the appropriate pulse width for that half cycle. The compensator output is representative of the desired duty cycle, which is normalized through a multiplier to represent the number of clock cycles from a high frequency clock. In this case, samples alternate between modulating the leading edge and the trailing edge, where the middle of the pulse is always fixed relative to Fsw.

In the exemplary description of the double edge modulated embodiment of the invention, the exemplary desired pulse width is 4.33 clock cycles+4.85 clock cycles. As in the single edge modulation embodiment, an exemplary PWM generator uses programmable counters to generate the appropriate coarse pulse widths of 4 cycles, 4.5 cycles, and 5 cycles, and then uses interpolation between these coarse pulse widths to obtain the desired fine pulse width (FPW). As a feature of this embodiment, a plurality of counters is used.

The method, in accordance with the invention, is the generation of a precise fine pulse width pulse that is variable in width in a train of pulses from one switching frequency cycle (one PWM phase time) to the next. Briefly, this is accomplished by generating a first pulse having a first coarse pulse width; generating a second pulse representing a delayed coarse pulse having a second coarse pulse width; generating a third pulse representing a doubly delayed coarse pulse having a third coarse pulse width; and interpolating among the pulse width of said first, second and third pulses to generate the fourth pulse having a precisely variable fourth pulse width.

These and other features of the invention will become more apparent in the following more detailed description and claims when considered in connection with the drawings.

BRIEF DESCRIPTION OF THE DRAWINGS

FIG. 2 is a schematic diagram of an embodiment of the invention illustrating a single edge modulation pulse width modulation (PWM) generator;

FIG. 3A is a schematic diagram of an embodiment of a single edge modulation fine interpolator in accordance with the invention;

FIG. 4A is a truth table illustrating binary to thermometer code conversion of the thermometer encoder in FIGS. 3A and 3B;

FIG. 4B is a truth table illustrating the operation of the decoder in FIG. 3B;

FIG. 5B is a circuit diagram illustrating a detail of an analog interpolator;

FIG. 5C is a circuit diagram illustrating a portion of an analog interpolator;

FIG. 5D is a circuit diagram illustrating a portion of an analog interpolator;

FIG. 9 is a series of pulse train diagrams illustrating the operation of a double edge modulation PWM generator;

DETAILED DESCRIPTION

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g. resistors, transistors, capacitors, inductors and the like, whose values may be suitably configured for various intended purposes. Any actual values provided for such components as well as applied voltage levels and currents are intended by way of example and not limitation.

In addition, the present invention may be practiced in any integrated circuit application. Such general applications and other details that will be apparent to those skilled in the art in light of the present disclosure are not described in detail herein. Further, it should be noted that while various components may be suitably coupled or connected to other components within exemplary circuits, such connections and couplings can be realized by direct connection between components, or by connection through other components and devices located therebetween.

Figure 1:
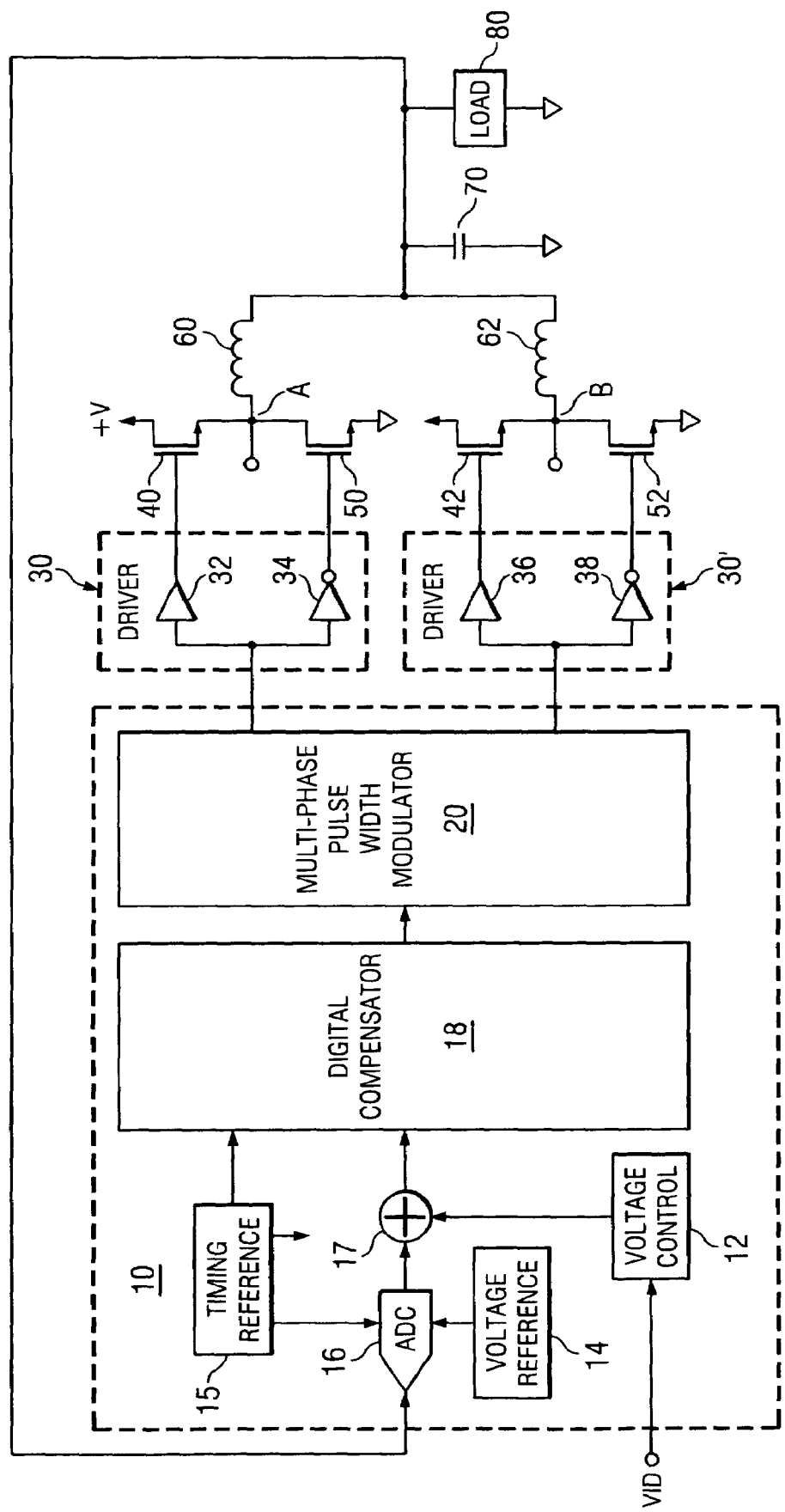
FIG. 1 is a schematic diagram of a digital multiphase buck regulator that was disclosed in some of the related patent applications cross-referenced herein.

Refer now to FIG. 1, which is a schematic diagram of a Digital Multiphase Buck Regulator that has previously been described in detail, for example, in the cross-referenced patent applications that have been incorporated herein by reference. It is also known as a Digital Multiphase Buck Converter because it converts a relatively high supply potential (+V) at e.g. 12 volts to a low voltage, e.g. 1 to 3 volts provided to a load at very high current levels. Digital controller 10 is shown including Digital Multi-phase Pulse Width Modulator (PWM) 20, although frequently PWM 20 is depicted as a distinct power stage. The output of PWM 20 is a series of pulses on each of the illustrated output lines, the phase 1 output being provided to driver 30 and the phase 2 output being provided to driver circuit 30'. In a multi-phase system having more than 2 phases, additional phases are connected in a similar manner. Low side FETs 50 and 52, inductors 60 and 62, and capacitor 70 are typically discrete devices. In each phase, (say phase 1 for example), a pulse output stage comprises a high side FET (40), a low side FET (50) and an inductor (60). Similarly, the pulse output stage for phase 2 comprises a high side FET 42, a low side FET 52 and an inductor 62. The pulse output stage charges up capacitor 70 and supplies power to the load. Load 80 is typically a microelectronic component, such as a microprocessor, requiring very accurate power that is regulated and maintained during rapidly changing power requirements.

Digital controller 10 receives a VID input at voltage control 12. VID is a binary number provided by the microprocessor manufacturer describing specific power requirements, in particular the set point, i.e. initial load line voltage at minimum current. Digital controller 10 can also have a reference voltage 14 that is applied to analog-digital converter 16 that also receives, as a second input, the voltage at load 80. The reference voltage from block 14 is used to calibrate the output of analog to digital converter ADC 16 to that reference voltage. Analog-digital converter 16 also receives a timing signal from timing reference 15, determining the sampling rate at which the analog values are sampled and converted to digital, i.e. binary numbers. The output of timing reference 15 is also supplied to the digital compensator 18 and elsewhere in the circuitry as may be required to achieve synchronous operation. The output of ADC 16 is a digital voltage value that is compared to the output of voltage control circuit 12 (the target voltage) in summer 17 and provided as a digital error voltage to digital compensator 18. Digital compensators such as digital compensator 18 that provide inputs to multi-phase pulse width modulators, such as PWM 20 are well known and described for example in the above cross-referenced patent application, SYSTEM, DEVICE AND METHOD FOR PROVIDING VOLTAGE REGULATION TO A MICROELECTRONIC DEVICE, Ser. No. 10/103,980, filed Mar. 22, 2002, inventors: Duffy et al. of which an inventor in this application is a coinventor. Digital compensator 18 then provides an input to PWM 20 in order to modify the width of the pulses provided to the drivers 30 and 30', etc. of each of the two phases in the illustrated example, and other phases, when utilized. Phase 1 is driven by driver circuits 32 and 34. Circuit 32 drives the gate of FET 40 with a signal that is complementary to the output of circuit 34 that drives the gate of FET 50. FET 40 and 50 have their drain-source paths connected in series, at a common point A, between a first potential source (+V) and a second potential source (ground). Since both FET 40 and 50 are shown as N-channel devices, only one of the two transistors is on at any one time. Of course, if transistor 40 were to be replaced with a P-type transistor, then the same phase signal could be used to drive the gate of both transistor 40 and 50. In either case, there is never a direct current path between +V and ground.

The phase 2 output of PWM 20 is provided to circuits 36 and 38 during phase 2 time in the same way that circuits 32 and 34 receive the pulse width modulate signals during phase 1 time. Circuit 36 then drives the gate of FET 42 and circuit 38 drives the gate of FET 52. Note that although two phases are shown, any number of phases can be used. Larger number of phases provides smoother and more accurate power to the load.

In operation, during phase 1, while the pulse width modulated waveform turns high side FET 40 on, current flows through FET 40 into node A and through inductor 60 to charge capacitor 70 and provide power to load 80. On the other hand, when low side FET 50 is turned on, current flows through FET 50. High side FET 42 and low side FET 52, connected in common at node B operate in a similar manner during phase 2. The voltage from the load 80 is fed back to ADC 16 so that the voltage to the load can be adjusted to changing load conditions. It is desirable to also measure the voltage at node A and node B (and other corresponding nodes in systems with more phases) as an indication of the current being supplied to the load. The cross-referenced patent applications show how the measurements taken at nodes A and B are then used to better regulate the power provided to load 80. Although such a system operates satisfactorily, it has been found that improved power regulation to the load is achieved by more accurately regulating the pulse width of pulses produced by PWM 20. The generation of such fine resolution pulses by PWM 20 will now be described.

Refer now to FIG. 2, which is a schematic diagram of one phase of a single edge modulation PWM Generator 200, in accordance with an embodiment of the invention. PWM generator 200 generates one phase of the multi-phase Pulse Width Modulator (PWM) 20 illustrated in FIG. 1. As a first input 202, it receives the output of digital compensator (18 in FIG. 1). The output of digital compensator 18 is a binary number representing the duty cycle. As is well known, the magnitude of the duty cycle number determines the width of the pulse produced by the PWM Generator 200. The actual duty cycle number is the ratio of time that the pulse is up divided by the maximum time the pulse could be up (to achieve 100% duty cycle).

The duty cycle input at 202 is received by multiplier 204; which multiplies the duty cycle number by Kmod. Kmod is a fixed number representing the number of clock cycles corresponding to a 100% duty cycle. By way of example, if the maximum number of clock cycles (to achieve maximum pulse width, i.e. 100% duty cycle) is 24 and the duty cycle number is 4.3 divided by 24, then the output of multiplier 204 is 4.3. The output of multiplier 204 is connected to counter 206 by bus 207' and interpolator 208 by bus 209'. Bus 207' carries the most significant bits (MSB's), i.e. the number to the left of the decimal point, while bus 209' carries the least significant bits (LSB's), i.e. the number to the right of the decimal point. As a second input 210, PWM generator 200 receives the high frequency clock input Flo, as the clock input to counter 206, and interpolator 208. Such a high frequency clock can operate, for example, at 156.25 Mhz, which is the equivalent of a 6.4 ns period.

As a third input 212, PWM generator 200 receives the switching clock Fsw waveform at edge detect circuit 214. Edge detect circuit 214 produces an Fsw edge pulse that is a pulse having a delayed leading edge and a pulse width of one cycle of clock signal Flo. The leading edge of Fsw edge is applied to the Load input of counter 206 by conductor 216 and the falling edge of Fsw edge is applied to the set (S) input latch circuit 218 by conductor 220. When the leading edge of Fsw edge is received at the Load input, counter 206 begins counting pulses at the rate set by the clock input. When the count limit of the most significant bits, e.g. 4 by way of example, has been reached counter 206 provides a terminal count (TC) signal on line 222 to reset latch 218. In this way latch 218 is set by the falling edge of Fsw edge pulse on line 220 and reset by the falling edge of TC pulse on line 222. The output Q of latch 218 is then a pulse that is four clock cycles wide (in this example where the MSB input to counter 206 was 4. Continuing with this example of a 156.25 mhz clock having a 6.4 ns period, 4 clock cycles provides a pulse that is 25.6 ns wide on line 224. This is the coarse pulse width (CPW) applied as an input to interpolator 208. Interpolator 208 combines the received input signals to produce a pulse width of 4.33 clock cycles (with the assumed example of the six least significant bits indicating a number to the right of the decimal point being 0.333 etc.) This is the fine pulse width (FPW) achieved with 100 ps resolution. Any desired resolution can be achieved and is equal to the cycle period of the high frequency clock divided by 2 to the n power, n being equal to the number of bits that define the LSB. In the current example, the LSB are defined by 6 bits (fpwm[0] to fpwm[5]) and the high frequency clock has a period of 6.4 ns. 6.4 ns divided by 2 to the sixth power equals 100 ps, the exemplary resolution. The number of MSB's required is determined by the maximum required pulse width. As is well known, 5 binary bits would provide for a pulse width of up to 32 clock cycles, which is certainly adequate for use in the current example that allows a maximum pulse width of 24 clock cycles.

In summary, as illustrated in FIG. 2, there is described a pulse width modulation pulse generator where circuitry comprising a counter 206 receives the most significant bits and is configured (in conjunction with the disclosed logic circuitry also comprising latch 218) to convert the value of the most significant bits into the coarse pulse width pulse CPW. A fine interpolator 208 is coupled to the output of counter 206 (via latch 218) to receive the coarse pulse width pulse CPW. Interpolator 208 also receives the least significant bits to perform interpolation between two or more coarse pulse width waveforms. The least significant bits and the two or more coarse pulse width waveforms are coupled to an analog interpolator to perform the interpolation as will now be described.

Refer now to FIG. 3A that shows one embodiment of a single edge modulation fine interpolator 208 in schematic form. This is an exemplary 3 bit fine interpolator. Interpolator 208 receives, as a first input, the coarse pulse width pulse (CPW) on line 302 into half delay circuit 304 and also into analog interpolator 340. As a second input, fine interpolator 208 receives the high speed clock signal Flo on line 308, at the input of ½ delay circuit 304. The output of circuit 304 (the delayed CPW signal), as well as the CPW signal are provided to OR circuit 312, which combines the two input signals to provide delayed coarse pulse width pulse CPW_d on line 314.

Assuming, by way of example only, that there are 3 least significant bits (LSB's), these are coupled to the input of thermometer encode circuit 332. The binary value of the 3 inputs is translated to outputs on lines T1-T7. Thermometer encode circuits are well known and translate binary inputs to thermometer outputs in accordance with the truth table of FIG. 4A. The truth table of FIG. 4A is self explanatory and requires no further explanation as it is well know to those skilled in the art. The benefit of using a thermometer encode in this invention is that only one of the lines T1-T7 is changed at any one time as the binary code is incremented or decremented. These seven inputs are coupled to the input of an analog interpolator 340. An eight input (To) to analog interpolator 340 is connected to ground in this example. The output of analog interpolator 340 is connected to an input of differential amplifier 341. As this input traverses a reference potential (zero crossing) the output of differential amplifier 341 changes its binary state. The output of 341 is passed through buffer 362 to produce the fine pulse width FPW signal.

Figure 3B:
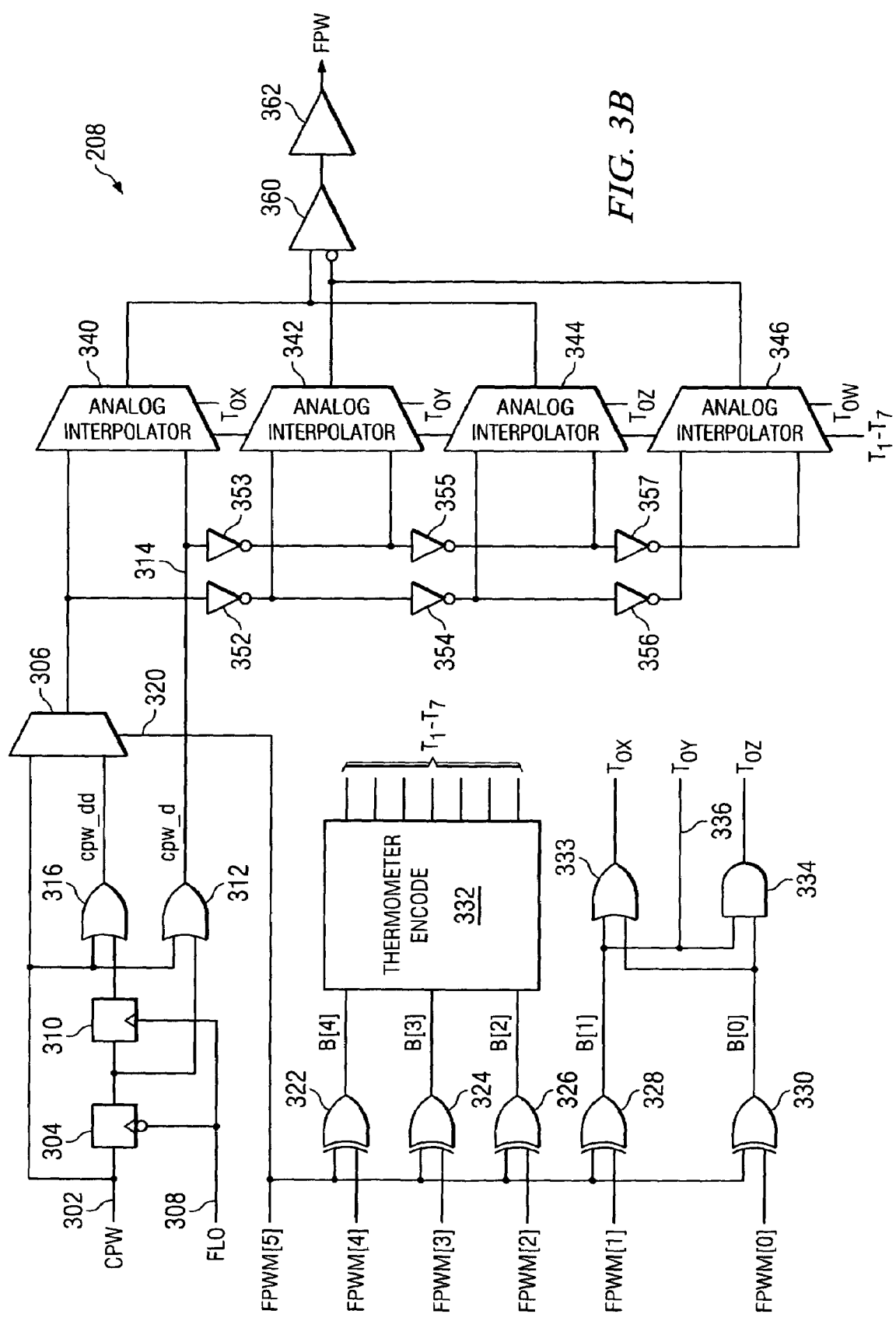
FIG. 3B is a schematic diagram of another embodiment of a single edge modulation fine interpolator in accordance with the invention.

Refer now to FIG. 3B that shows another embodiment of a single edge modulation fine interpolator 208 in schematic form. This is an exemplary 6 bit fine interpolator. Interpolator 208 receives, as a first input, the coarse pulse width pulse (CPW) on line 302 into half delay circuit 304 and 2:1 multiplex circuit multiplex circuit 306. As a second input, fine interpolator 208 receives the high speed clock signal Flo on line 308. One edge of the second input is received at the complement input of ½ delay circuit 304, the other edge at ½ delay circuit 310. The output of circuit 304 and the CPW signal are provided to OR circuit 312, which provides delayed coarse pulse width (CPW) output CPW_d on line 314. The output of circuit 310 and the CPW signal are provided to OR circuit 316 which provides a doubly delayed coarse pulse width output CPW_dd to multiplexer 306. Multiplexer 306 then provides either a CPW or CPW_dd signal on output line 318, depending on whether the input on line 320 is a binary 0 or 1. Note that input line 320 is one of the outputs (in this case fpwm[5]) which is the most significant of the least significant bits) on output bus 209' of the multiplier 204 (FIG. 2). In the current example, the output of digital compensator 18 has been assumed at 4.33 so that the value of the LSB output is 0.33. The signal on line 320 will be "0" if the number is between 4.0 and 4.5 and "1" if the number is between 4.5 and 5.0. In turn, the output of multiplexer 306 will be a pulse width of 4 if the input on line 320 is "0" and a pulse width of 5 if the input on line 320 is "1".

The other 5 LSB outputs of multiplier 204 (FIG. 2) i.e. least significant bits (LSB's) fpwm[0] to fpwm [4], as well as fpwm [5] are also inputted to exclusive OR circuits 322, 324, 326, 328, and 330, as shown. These XOR circuits operate in their usual and customary manner. Thus, when fpwm[5] is at a binary "0", the true value of LSB's fpwm[0] to fpwm[4] are passed through each of the XOR circuits unchanged. As the numeric value of these LSB's increases, the fine pulse width increases, as will be explained hereinbelow. At this point, it is sufficient to note that as the value of fpwm[5] switches from "0" to "1", when the output of multiplex circuit 306 is switched from CPW to CPW_dd, the outputs of all the XOR's are inverted, as well. Thus, as the encoders (thermometer encoder T1-T7) receive inverted inputs to encode and pass on to the control electrodes of the transistors in FIG. 5A, the control electrodes previously receiving the cpw signal now receive the CPW_dd signal. This allows for a smooth transition as the output of the analog interpolator begins to produce a fine pulse width in the range of 4.5 to 5 clock cycles. (instead of 4.0 to 4.5 clock cycles when the CPW signal was received)

The outputs of exclusive OR circuits 322, 324, and 326 are coupled to the thermometer encode circuit 332. The binary value of the 3 inputs is translated to outputs on lines T1-T7. Thermometer encode circuits are well known and translate binary inputs to thermometer outputs in accordance with the truth table of FIG. 4A. The truth table of FIG. 4A is self explanatory and requires no further explanation as it is well know to those skilled in the art. Note that the binary number outputted from XOR circuit 322 is B[4], the output of XOR 324 is B[3] and the output of XOR 326 is B[2}. This nomenclature is consistent with the fpwm [4], [3], and [2] designations. The benefit of using a thermometer encode in this invention is that only one of the lines T1-T7 is changed at any one time as the binary code is incremented or decremented.

As shown in FIG. 3B, the seven thermometer code outputs T1-T7 are inputted to all 4 analog interpolators 340-346, giving each of them a weight of 4. These seven outputs multiplied by the weight of 4 gives a maximum weight of 28 to the thermometer code outputs T1-T7. On the other hand, the decoded output value of the LSB's fpwm[0] and fpwm[1] is inputted to the analog interpolators (see FIG. 4B) with a weight of one each and a total maximum weight of 3. This provides the circuit with 0 to 31 weighting and a 1/32 resolution.

With continued reference to FIG. 3B, the decoder function of circuits 333 and 334 is described. XOR circuit 328 provides an output to OR circuit 333, AND circuit 334 and line 336. Exclusive OR circuit 330 provides an output to OR circuit 333 and AND circuit 334. Depending on the input value of fpwm[0] and/or fpwm[1], the output value of the decoder is inputted to the analog interpolators as illustrated in FIG. 4B. Again, the benefits of using a thermometer encode is seen as only one of lines Tox, Toy, or Toz change at any one time. Tow shown as an input to analog interpolator 346 is tied to ground in this embodiment.

The signal on line 318 (waveform cpw or cpw_dd) and the signal on line 314 (waveform cpw_d) are inputted to analog interpolator 340. Similarly, those waveforms are coupled to analog interpolators 342, 344, and 346 with inverters 352, 353, 354, 355, 356, and 357, as shown. The use of four analog interpolator stages 340, 342, 344, and 346 compensates for the off-sets and errors, smooths out interpolation and improves linearity, i.e. the precision accuracy of the final fine pulse width FPW. In particular, inverters 352 and 353 couple the inverted waveforms from lines 314 and 318 to interpolator 342. Inverters 354 and 355 couple the re-inverted (original polarity with slight delay) to interpolator 344. Lastly inverters 356 and 357 couple the inverted waveforms to analog interpolator 346. In addition, each of the inverters receives an input from the decoder formed by OR circuit 333 and AND circuit 334 such that the Tox input is provided to interpolator 340, the Toy input is provided to interpolator 342 and the Toz input is provided to interpolator 344. In the case of the single edge modulation fine interpolator, analog interpolator 346 has one of its inputs tied to ground (e.g. 0 volts). The single ended outputs of analog interpolators 340 and 344 are connected to a first input of differential to single ended amplifier 360, while the outputs of interpolators 342 and 346 are connected to a complement input of amplifier 360. The output of 360 is passed through buffer 362 to produce the FPW (fine PWM) signal.

Figure 5A:
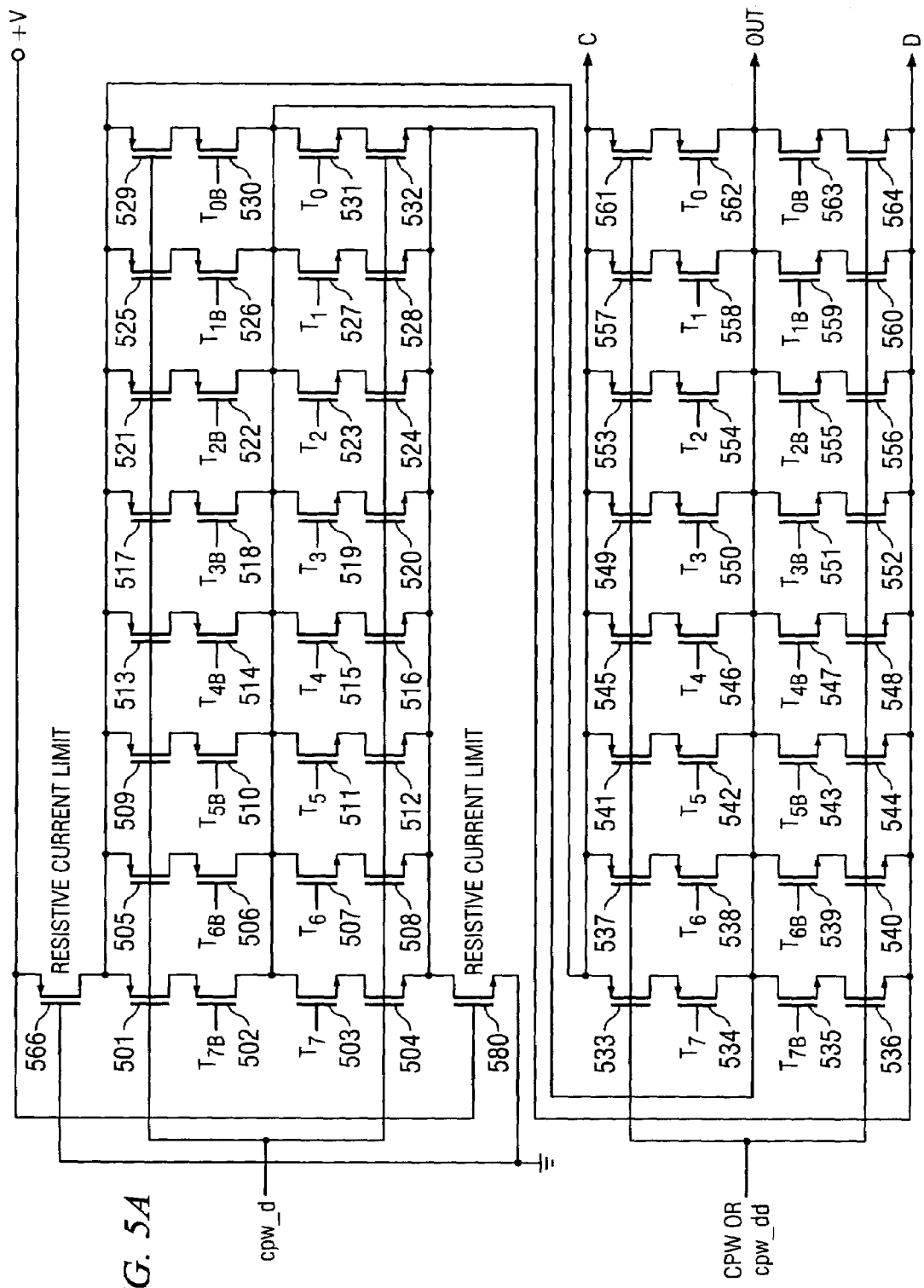
FIG. 5A is a circuit diagram illustrating an analog interpolator.

Refer now to FIG. 5A, which is a schematic diagram illustrating an embodiment of one of the stages of the analog interpolators, e.g. analog interpolator 340 in accordance with the invention. In the illustrated embodiment complementary metal oxide semiconductor (CMOS) field effect transistors (FETs) are shown. It is well known that CMOS transistors can be designed with channel regions having specific width to length ratios. That feature of CMOS FETs is utilized in the present invention to increase the inherent resistance value of each transistor to increase rise times thereby smoothing out transitions. Those skilled in the art will recognize implementations in other technologies.

The analog interpolator of FIG. 5A comprises 16 sets of series connected transistors. Each of the 16 sets (also known as "legs") includes 4 series connected FETs, coupled between a positive and negative potential source, to form an inverter. The first leg includes transistors 501, 502, 503, and 504. N-channel and P-channel devices have been designated in their customary and well-known manner. The second leg includes transistors 505, 506, 507, and 508. The third leg includes transistors 509-512. The fourth leg includes transistors 513-516. The fifth leg includes transistors 517-520. The sixth leg includes transistors 521-525. The seventh leg includes transistors 525-528. The eighth leg includes transistors 529-532. The ninth leg includes transistors 533-536. The tenth leg includes transistors 537-540. The eleventh leg includes transistors 541-544. The twelfth leg includes transistors 545-548. The thirteenth leg includes transistors 549-552. The fourteenth leg includes transistors 553-556. The fifteenth leg includes transistors 557-560. Lastly, the sixteenth leg includes transistors 561-564.

Transistor 566 is coupled between the positive potential source and the commonly connected upper end of all the legs, at node C. Transistor 580 is coupled between the negative potential source and the commonly connected lower end of all of the legs at node D. Transistors 566 has its gate electrode connected to ground and transistor 580 has its gate electrodes connected to the positive potential source to provide resistive current limiting. Current limiting across all the legs is balanced by the use of the same 2 transistors for all the legs. As has been noted, the circuit of FIG. 5A is being described as the detail of analog interpolator 340. However, the other analog interpolators 342, 344, and 346 are substantially identical, with only minor differences. In this regard, nodes C and D are commonly connected in all 4 analog interpolator stages further balancing the current limiting of transistors 566 and 580. Furthermore, a single pair of current limiter transistors 566 and 580 located only in one analog interpolator stage, e.g. in analog interpolator 340 but not in analog interpolators 342, 344, and 346 is used to provide balanced current limiting in all four interpolators.

Transistors 501, 505, 509, 513, 517, 521, 525, 529, 504, 508, 512, 516, 520, 524, 528, and 532 receive the CPW_d input at their respective gate electrodes. Transistors 533, 537, 541, 545, 549, 553, 557, 561, 536, 540, 544, 548, 552, 556, 560, and 564 receive the CPW or CPW_dd input (as selected by multiplexer 306) at their respective gate electrodes. The output of thermometer encoder 332 is received at the gate electrodes T1, T2, T3, T4, T5, T6, and T7. The inverted output of thermometer encoder 332 is received at the gate electrodes T1b, T2b, T3b, T4b, T5b, T6b, and T7b. The output of all the inverters is connected together and becomes the output of the analog interpolator.

With continued reference to FIG. 5A, refer also to FIG. 5B illustrating an exemplary inverter connection. Thus, the input To is inverted in inverter 570 to produce T0b, inverter 571 produces T1b, inverter 572 produces T2b, and inverter 577 produces T7b. Signals T3-T6 are connected in the same manner although not specifically shown in the drawing.

By way of further illustration, see FIG. 5C showing the connection of the T0x input to analog interpolator 340. FIG. 5C illustrates the transistors that also receive either the CPW or CPW_dd signal at the gate electrodes of transistors 561 and 564. The T0 signal is coupled to the control electrode of transistor 562 while the inverted signal T0b is coupled to the gate electrodes of transistor 563. The T0y input to analog interpolator 342 is similarly connected. Also, the input T0z is similarly connected to analog interpolator 344. The T0w input is similarly connected to analog interpolator 346. In the currently described embodiment, i.e. single edge modulation, T0w is tied to a fixed potential source such as ground.

By way of further illustration, see FIG. 5D showing additional connections of the T0x input to analog interpolator 340. FIG. 5D illustrates the leg comprising the transistors that receive the CPW_d signal at the gate electrodes of transistors 529 and 532. As described herein and also by reference to the waveforms, an analog converter receives two coarse pulse width inputs at any one time: 1. the CPW_d signal and 2. one of either the CPW or CPW_dd signal. At any instant of time, it is possible for both these waveforms to be at the same level, e.g. down level or up level, or for one of these waveforms to transition from one level to the other while the other one of the two waveforms remains unchanged. The output of the analog interpolator will then vary in accordance with the control signals. The T0 signal is coupled to the gate electrode of transistor 531 while the inverted signal T0b is coupled to the gate electrode of transistor 530. The T0y input to analog interpolator 342 is similarly connected. Also, the input T0z is similarly connected to analog interpolator 344. The T0w input is similarly connected to analog interpolator 346. In the currently described embodiment, i.e. single edge modulation, T0w is tied to a fixed potential source such as ground. Also illustrated in FIGS. 5C and 5D are the current limiting transistors 566 and 580.

In the case of analog interpolator 340, the gate electrodes To are connected to the Tox output of OR circuit 333. In the case of analog interpolator 342, the gate electrodes To are connected to the Toy output of exclusive OR circuit 328. In the case of analog interpolator 344, the gate electrodes To are connected to the Toz output of AND circuit 334. In the case of analog interpolator 346, the gate electrodes To are connected to ground potential. As previously noted and described in FIG. 5B, the "b" suffix in each case designates that the inverted signal is applied. Collectively, the decoded LSB's applied to the gate electrodes T0-T7 and T0b-T7b control the fine pulse width resulting from the output of the analog interpolators.

In the operation of FIG. 5A, as the earliest of the coarse pulses transitions from high to low, the output of analog interpolator transitions from high to low a short time thereafter, depending on how many of the control electrodes To to T7 (and conversely Tob to T7b) are up and down. When the output of the four analog interpolators is inputted to the two inputs of differential to single end output amplifier 360, it performs the usual function of differential amplifiers. That is, as the higher one of the inputs decreases in value while the lower one of the inputs increases, when the relative magnitude of the two inputs reverses (also known as a zero crossing), the output of the differential to single ended amplifier 360 that is inputted into buffer 362 changes state and causes buffer circuit 362 to change the state of its output thereby causing the trailing edge of the fine pulse width pulse to transition from high to low and providing the desired pulse width.

As an example of the operation of the circuit of FIG. 5A, continue with the assumption that the fine pulse width to be achieved is 4.33 cycles wide. In this case, the signal received from multiplexer circuit 306 (FIG. 3B) is the CPW signal having a coarse pulse width of 4. The up level of this pulse is applied to the control electrodes of transistors 533, 537, 541, 545, 549, 553, 557 and 561. Since these transistors are P channel, they are held non-conducting when a high level signal is applied. The same CPW pulse is applied to the control electrodes of transistors 536, 540, 544, 548, 552, 556, 560 and 564. Since these transistors are N channel, they are in their conducting mode when an up level pulse is applied.

The CPW_d pulse is applied to the control, i.e. gate electrodes of P channel transistors 501, 505, 509, 513, 517, 521, 525, 529, and N channel transistors 504, 508, 512, 516, 520, 524, 528, and 532. All four interpolators 340, 342, 344, and 346 receive either the true or delayed inverted CPW and CPW_d pulses. The interpolation then takes place under the control of the encoders. The encoders provide control signals Tox, Toy, Toz, T1-T7 and the complements thereof to the correspondingly labeled control, i.e. gate electrodes. Depending on the value of the control signals from the encoders, one of the upper or lower two transistors in each leg will turn on and if the corresponding second transistor is turned on by either the CPW or CPW_d pulse then that half of the leg will turn on pulling the output up or down (depending on whether the upper two or lower two transistors are conducting). The encoders provide these control signals to all four analog interpolators as shown in the drawings. In this example, the fine pulse FPW will end a certain time delay after the CPW pulse ends, that time delay being determined by the control signals from the decoders of the LSB signals.

Those skilled in the art know will how to select and dimension P channel and N channel transistors to achieve the desired performance and polarity pulse at the output of each analog interpolator stage. Also, differential amplifier 360 can be of conventional construction with true and complement outputs. Those skilled in the art will know which output of the differential amplifier to select to obtain the desired polarity of the fine pulse width pulse FPW.

As previously noted, the value of the control inputs to the analog interpolator are as shown in the truth tables of FIGS. 4A and 4B. Those skilled in the art will recognize which transistors are turned on and off in accordance with the illustrated truth table. Briefly, if all the encoders provide a "0", then all the transistors 535, 539, 543, 547, 551, 555, 559, and 563 will receive inverted "0"s, i.e. "1"s and will be conditioned ON. At the same time, transistors 503, 507, 511, 515, 519, 523, 527 and 531 will be conditioned OFF. In this scenario, the output will cause a trailing pulse end (in FPW) with the fall of the CPW pulse. As an increasing number of control inputs change to "1" and in particular after all inputs change to "1", the output will cause a trailing pulse change (in FPW) with the fall of the CPW_d pulse (i.e. a pulse width of about 4.5).

As the desired pulse width becomes greater than 4.5, the CPW_dd pulse replaces the CPW pulse. At the same time, the inputs to the decoders are inverted by exclusive OR circuits 322, 324, 326, and 328 (FIG. 3B). Therefore, an all "0"s input from the LSB's actually provides an all "1"s input (inverted to "0"s at Tob to To7) turning transistors 535, 539, 543, 547, 551, 555, 559, and 563 OFF.

This results in the trailing edge of the fine pulse width pulse to be the same as the trailing edge of CPW_d. As the binary number identifying the desired pulse width increases, an increasing number of transistors 535, 539, 543, 547, 551, 555, 559, and 563 will turn ON. When all of transistors 535, 539, 543, 547, 551, 555, 559, and 563 are ON, the fine pulse width (PWM) pulse width will have a trailing edge at the same time as the trailing edge of the CPW_dd pulse.

Figure 6:
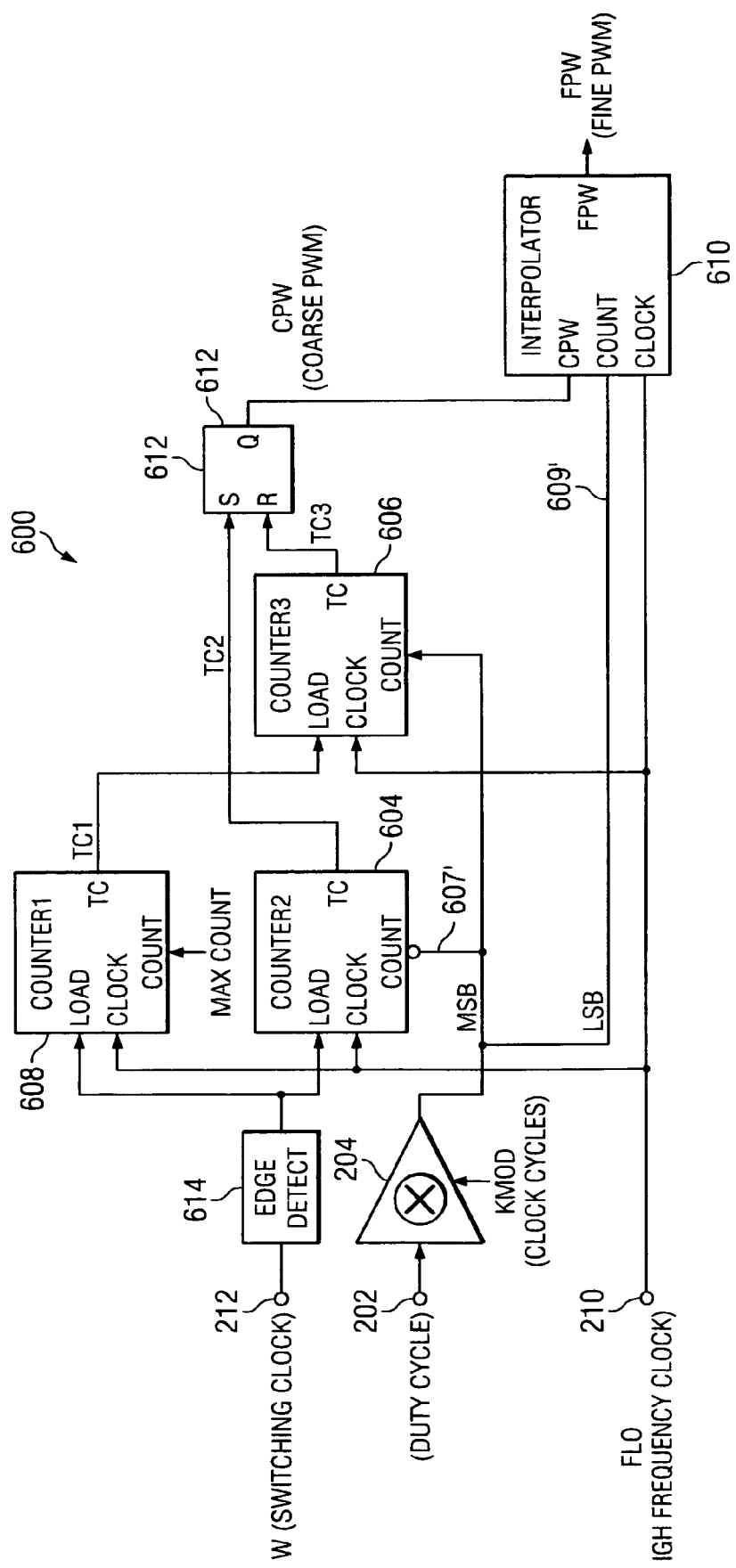
FIG. 6 is a schematic diagram of an embodiment of the invention illustrating a double edge modulation pulse width modulation (PWM) generator.

Refer now to FIG. 6; which is a schematic representation of a double edge modulation PWM generator in accordance with the present invention. This embodiment shares many components with the single edge modulation PWM generator that was described in connection with FIG. 2. Corresponding elements have been numbered with corresponding reference numerals. As in the FIG. 2 embodiment, double edge modulation PWM generator receives as a first input 202, the output of digital compensator (18 in FIG. 1). The duty cycle input at 202 is received by multiplier 204; which multiplies the duty cycle number by Kmod.

As a second input 210, PWM generator 600 receives the high frequency clock input Flo, as the clock input to counters 604, 606, 608 and interpolator 610. Such a high frequency clock can operate, for example, at 156.25 Mhz, which is the equivalent of a 6.4 ns period. As a third input 212, PWM generator 600 receives the switching clock Fsw waveform at edge detect circuit 614. Edge detect circuit 614 produces an Fsw edge pulse that is a pulse having a delayed leading edge and a pulse width of one cycle of clock signal Flo. The leading edge of Fsw edge is applied to the Load input of counters 604 and 608.

When the leading edge of the Fsw pulse is received at their respective Load inputs, counters 604 and 608 begin counting pulses at the rate set by the clock input. Counter 608 begins counting at 24, the maximum number of pulses for a 100% duty cycle. This maximum count is a fixed value that is pre-programmed into the counter. Counter 604 begins the count at the number 19 which is the 1's complement of 4. This is because the exemplary value of the MSB received from the multiplier 204 on line 607' is inverted at the input to counter 604.

When the count in counter 604 reaches "1", it provides an output TC2 and then stops at "0". The falling edge of TC2 sets latch 612 producing the leading edge of the coarse PWM pulse CPW. When counter 608 reaches its terminal count, it provides a TC1 pulse to the Load input of counter 606 so that counter 606 begins counting. When counter 606 reaches its terminal count (after counting the exemplary number 4 provided by the MSB input), it provides a TC3 output, the fall of which resets latch 612 causing the falling edge of CPW. The coarse PWM pulse (CPW) is received as an input to interpolator 610. Interpolator 610 receives, as a second input, the count of the least significant bits. As a third input, interpolator 610 receives the high frequency clock input Flo. The output of interpolator 610 is the fine pulse width modulated waveform FPW.

Figure 7:
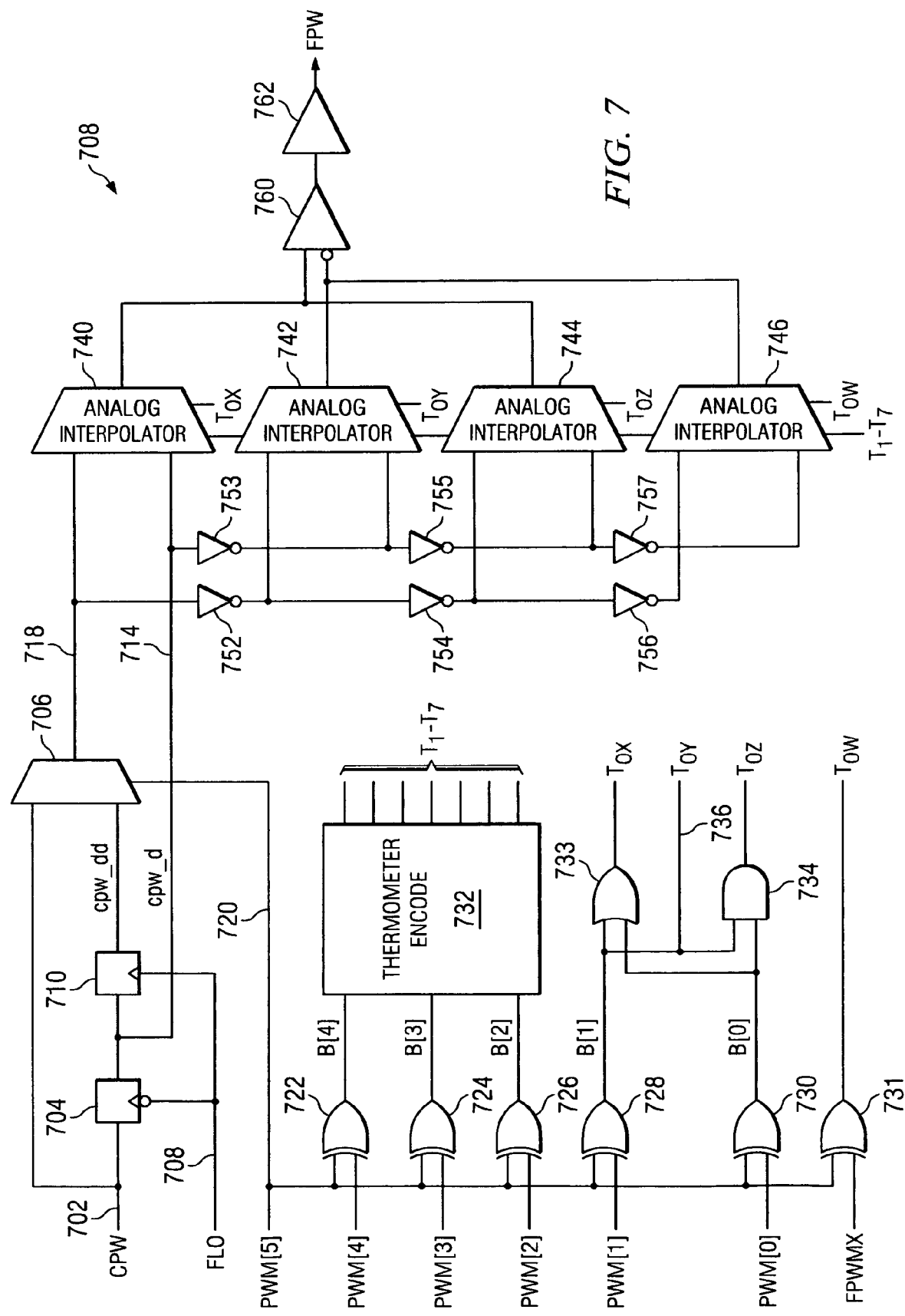
FIG. 7 is a schematic diagram of an embodiment of a double edge modulation fine interpolator in accordance with the invention.

Refer now to FIG. 7 for a description of another embodiment of this invention providing a double edge modulation fine interpolator. FIG. 7 shows a double edge modulation fine interpolator 708 that receives the outputs of the double edge modulation PWM generator 600 depicted in FIG. 6. Interpolator 708 receives, as a first input, the coarse pulse width (CPW) on line 702 into half delay circuit 704 and 2:1 multiplex circuit 706. As a second input, fine interpolator 708 receives the high speed clock signal Flo on line 708. One edge of the second input is received at the complement input of ½ delay circuit 704, the other edge at ½ delay circuit 710. The output of circuit 704 (a half cycle delayed coarse pulse width pulse CPW signal) is provided as an input to ½ delay circuit 710, which provides full cycle delayed coarse pulse width (CPW_dd) to multiplex circuit 706. Multiplexer 706 then provides either a CPW or CPW_dd signal on output line 718, depending on whether the input on line 720 is a binary 0 or 1. Note that line 720 is one of the outputs (in this case fpwm(5)) on the output bus 609' of the multiplier 204 (FIG. 6).

In the current example, the output of digital compensator 18 (FIG. 1) has been assumed at 4.33 so that the value of the LSB output on bus 609' is 0.33. The signal on line 720 will be "0" if the number is between 4.0 and 4.5 and "1" if the number is between 4.5 and 5.0. In turn, the output of multiplexer 706 will be a pulse width of 4 if the input on line 720 is "0" and a pulse width of 5 if the input on line 720 is "1". Line 720 is also provided as an input to exclusive OR circuits 722, 724, 726, 728, 730, and 731 as shown.

The other 5 outputs of multiplier 204 (FIG. 6) i.e. LSB's fpwm [0] to fpwm [4], are provided as a second input to exclusive OR circuits 722, 724, 726, 728, and 730, as shown. The double edge modulation fine interpolator has an additional exclusive OR circuit 731 that receives an fpwmx signal in addition to the fpwm[5] signal. The fpwmx signal is a binary "1" for leading edge interpolation and a binary "0" for trailing edge interpolation. The fpwmx signal goes high when the Fsw edge is detected and goes low when the leading edge computational period is finished, as indicated by the TC of counter 608.

The outputs of exclusive OR circuits 722, 724, and 726 are coupled to the thermometer encode circuit 732. The binary value of the 3 inputs is translated to outputs on lines T1-T7. Thermometer encode circuits are well known and translate binary inputs to thermometer outputs in accordance with the truth table of FIG. 4A. The truth table of FIG. 4A is self-explanatory and requires no further explanation as it is well know to those skilled in the art.

With continued reference to FIG. 7, XOR circuit 728 provides an output to OR circuit 733, AND circuit 734, and also an output on line 736. Exclusive OR circuit 730 provides an output to OR circuit 733 and AND circuit 734. Circuits 733 and 734 form a binary decoder function. Depending on the input value of fpwm[0] and/or fpwm[1], the output of the decoder is as illustrated in FIG. 4B.

The signal on line 718 (waveform CPW or CPW_dd) and the signal on line 714 (waveform CPW_d) are inputted to analog interpolator 740. Similarly, those waveforms are coupled to analog interpolators 742, 744, and 746 with inverters 752, 753, 754, 755, 756, and 757, as shown. In particular, inverters 752 and 753 couple the inverted waveforms from lines 714 and 718 to interpolator 742. Inverters 754 and 755 couple the re-inverted (original polarity with slight delay) to interpolator 744. Lastly inverters 756 and 757 couple the inverted waveforms to analog interpolator 746. In addition, each of the inverters receives an input from the decoder formed by OR circuit 733 and AND circuit 734 such that the Tox input is provided to interpolator 740, the Toy input is provided to interpolator 742 and the Toz input is provided to interpolator 744. Recall that In the case of the single edge modulation fine interpolator, the equivalent of analog interpolator 746 had one of its inputs tied to ground (e.g. 0 volts). In the case of the double edge modulation fine interpolator, as shown in FIG. 7, analog interpolator 746 receives an input Tow from exclusive OR circuit 731. The single ended outputs of analog interpolators 740 and 744 are connected to a first input of differential to single ended amplifier 760, while the outputs of interpolators 742 and 746 are connected to a complement input of amplifier 760. The output of 760 is passed through buffer 762 to produce the FPW (fine PWM) signal.

Refer now again to FIG. 5A, which is a schematic diagram illustrating an embodiment of one of the stages of the analog interpolators, e.g. analog interpolator 746 in accordance with the invention as disclosed in FIG. 7. In the illustrated embodiment complementary metal oxide semiconductor (CMOS) field effect transistors (FETs) are shown. Those skilled in the art will recognize implementations in other technologies. Each of the 16 "legs" includes 4 series connected FETs, coupled between a positive and negative potential source, to firm an inverter. The first leg includes transistors 501, 502, 503, and 504. The polarity of N-channel and P-channel devices has been designated in their customary and well known manner. The second leg includes transistors 505, 506, 507, and 508. FIG. 5A was previously described in connection with the analog interpolators in the single edge modulation fine interpolator disclosed in FIG. 3B. A distinction to be noted in connection with the double edge modulation fine interpolator shown in FIG. 7 is that analog interpolator 746 receives an input identified as Tow. This input is received at the gate electrode of transistors 531 and 562. The complement of Tow is received at transistors 530 and 563. This distinction is illustrated more clearly in FIG. 5D. Note that for double edge modulation, T0w is not tied to a fixed potential but rather is the output of XOR circuit 731 providing an output in response to the fpwmx and fpwm[5] inputs. Otherwise, the analog interpolators used for single edge and double edge modulation are the same.

The operation of this invention will be best understood by reference to the waveforms in conjunction with the schematic diagrams. Accordingly, refer now to FIG. 8 and back to FIGS. 2 and 3 for the operation of the single edge modulation embodiment. The top waveform is the high-speed train of pulses—clock Flo. In this example, 24 clock cycles represent the time interval of a PWM clock cycle. The binary number representing the duty cycle of the first full cycle is 4.33 divided by 24 (the number of clock cycles corresponding to 100% duty cycle) and the binary number representing the duty cycle for the second cycle is 4.85 divided by 24. These numbers are normalized by multiplier 204 (FIG. 2) which multiplies the duty cycle number input by Kmod (the number of clock cycles corresponding to 100% duty cycle, i.e. 24 in this example. Since in this example, the first pulse period is to have a fine pulse width of 4.33, binary 4 is routed to the count input of counter 206 on bus 207 and the binary value of 0.33 is routed to interpolator 208. (all as shown in FIG. 2)

The Fsw switching clock comes to its high level for the first half of the switching frequency cycle (12 Flo clock pulses) and switches to its low level for the second half cycle. The Fsw edge pulse comes to its high level after a delay and returns to its low level in one cycle of the Flo pulse. The Fsw edge pulse is the output of edge detect circuit 214 (FIG. 2). The counter 206 receives this pulse and loads the binary number 4 (the value of the MSB's) and begins counting until it counts down to "1" to generate the terminal count pulse TC and then stops at "0".

The trailing edge of the Fsw edge pulse sets latch 218 and causes the CPW pulse to rise. As CPW rises, it provides an input to OR circuits 312 and 316 (FIG. 3B) causing CPW_d and CPW_dd to also rise. These high level pulses (cpw_d and cpw or cpw_dd) are applied to analog interpolator 340. The same pulses that are slightly delayed and inverted are applied to analog interpolator 342. The same signals are slightly delayed and inverted again and applied to analog interpolator 344. The same delayed signals are delayed again and inverted again and applied to analog interpolator 346. At the same time the encoder outputs, i.e. control signals are applied at the transistor control electrodes T0 to T7 and the inverted control signals at T0b to T7b, turning certain ones of the N channel and P channel transistors on depending on the actual value of the inputs. The result is that a certain number of legs will have the two series connected upside transistors conducting while a certain number of legs will have the two series connected downside transistors conducting. This determines the length of time delay at which the output changes state (zero crossing) after the trailing edge of the coarse pulse has changed state. Thus, the pulse width of FPW is determined by a trailing edge that is an interpolation of the CPW_d and CPW or CPW_dd pulses.

The CPW pulse returns to its low level first as the TC pulse goes to its low level and resets latch 218 (FIG. 2). In this example, the width of the CPW is 25.6 ns. (This pulse width is obtained from the binary number 4 (the value of the MSB's) times 6.4 ns (one cycle of Flo). Note that if the binary value of the MSB were the number 1 then the pulse width of CPW would be 6.4 ns. The trailing edge of CPW_d is delayed by one half cycle (of clock pulse Flo) in half delay circuit 304 and thus at the output of OR circuit 312 on line 314 (FIG. 3B). The trailing edge of CPW_dd is doubly delayed as it is delayed by an additional half cycle in half delay circuit 310 (FIG. 3B). Those skilled in the art will recognize other means by which CPW can be thus delayed to provide CPW_d and CPW_dd.

Figure 8:
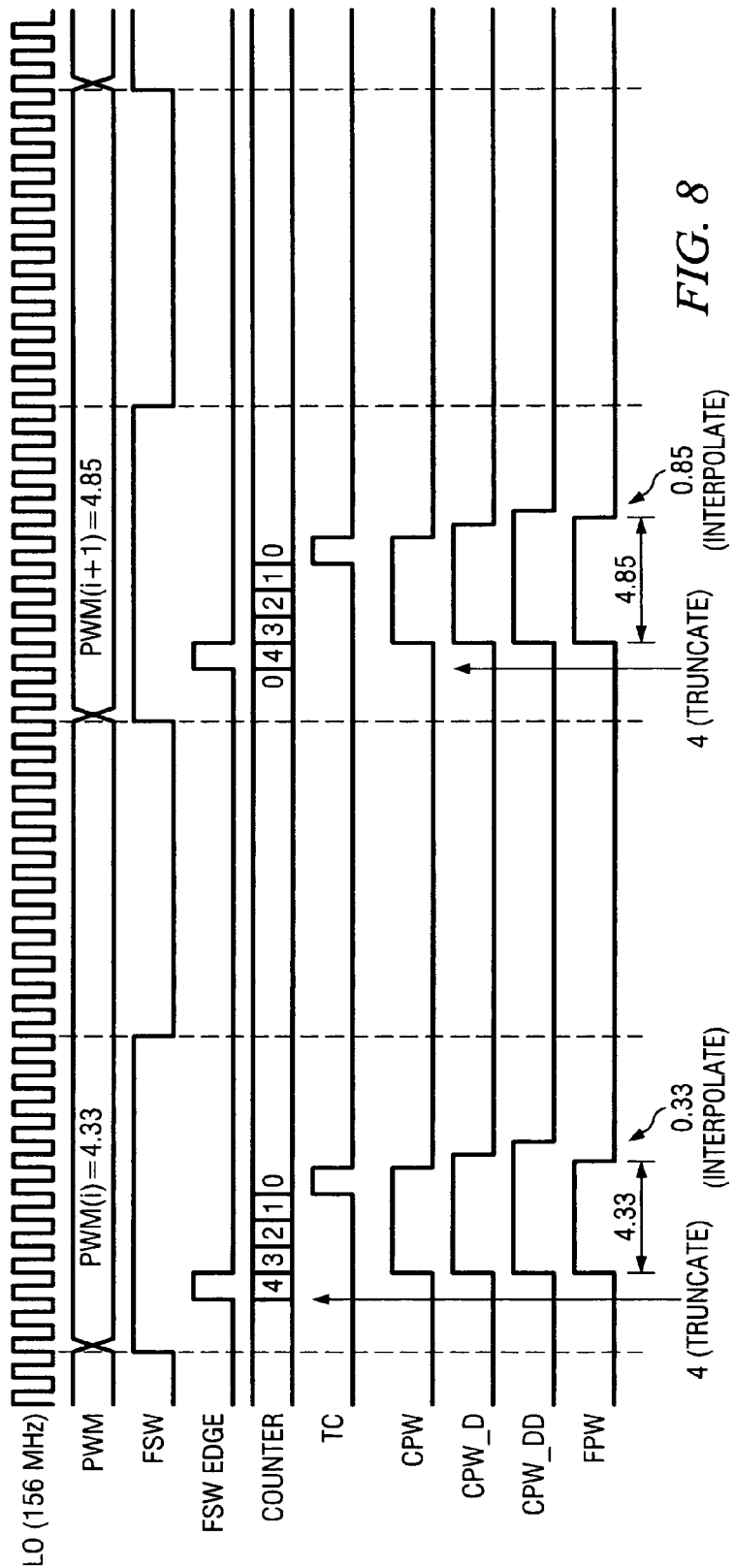
FIG. 8 is a series of pulse train diagrams illustrating the operation of a single edge modulation PWM generator.

With continued reference to FIG. 8, note that the final fine pulse width FPW is 4.33 (less than 4.5), resulting from an interpolation between the trailing edge of CPW and CPW_d. (This final interpolation takes place in the analog interpolators which are digitally controlled to produce an analog sum by weights.) However it is important to note that multiplex circuit 306 (FIG. 3B) has outputted the CPW pulse on line 318 in response to the most significant of the least significant bits LSBs (fpwm[5]) providing a "0" input. Note that in the subsequent PWM cycle, i.e. PWM(i+1)=4.85

(greater than 4.5) where a pulse width generated in response to a binary 4.85 is desired, interpolation in the analog interpolators is between the trailing edge of CPW_d and CPW_dd. This occurs because multiplex circuit 306 (FIG. 3) has outputted the CPW_dd pulse on line 318 in response to the most significant lsb (fpwm[5]) providing a "1" input. The disclosed circuitry provides a smooth transition in each step of interpolation, including the step where the trailing edge of the FPW pulse transitions from the final interpolation with cpw to the initial interpolation with cpw_dd.

The operation of the double edge modulation embodiment of this invention will be best understood by reference to the waveforms in conjunction with the schematic diagrams. Accordingly, refer now to FIG. 9 and back to FIGS. 6 and 7 for the operation of the double edge modulation embodiment. As in the single edge modulation embodiment, the top waveform is the high-speed train of pulses—clock Flo and 24 clock cycles represent the time interval of a PWM clock switching frequency cycle. Two PWM clock switching frequency cycles, i.e. PWM(i)=4.33 and PWM(i+1)=4.85 are illustrated. The binary number representing the duty cycle of the first full cycle is 4.33 divided by 24 (the number of clock cycles corresponding to 100% duty cycle) and the binary number representing the duty cycle for the second cycle is 4.85 divided by 24. These numbers are normalized by multiplier 204 (FIG. 6) which multiplies the duty cycle number input by Kmod (the number of clock cycles corresponding to 100% duty cycle, i.e. 24 in this example.

FIG. 6 shows an exemplary implementation of the double edge modulation pulse width generator. For the first half cycle, the half clock period is loaded into a counter, such that the end of the half period is known. At the same time, the digital pulse width word is truncated and inverted, generating the one's complement of the MSBs, and loaded into another counter, corresponding to integral clock cycles of the coarse pulse width for the half cycle. The counter is a down counter which generates a terminal count (TC) when it reaches 1 and then stops at 0. The TC is used to set an SR latch and the output of the latch for that half period is the coarse pulse width (CPW). Note that this is rounded up from the pulse width word, since the one's complement was used. Note that the SR latch can be the traditional asynchronous SR latch, or can be synchronized to the clock signal. In either case the CPW will have the desired width.

For the second half of the cycle, the second digital pulse width word is truncated and loaded into a third counter, corresponding to integral clock cycles of the coarse pulse width for the second half cycle. The counter TC is used to reset the SR latch and the output of the latch for that half period is the coarse pulse width (CPW). The total coarse pulse width is the rounded up first pulse width word plus the rounded down second pulse width word.

As shown in FIG. 9, the Fsw edge pulse is utilized only once for every two PWM clock cycles. Also, three separate counters are used to produce three separate counts. Counter 1 (see 608 in FIG. 6) is loaded with the number 24 (the maximum count of clock cycles for 100% duty cycle) and begins counting down from the time it receives the Fsw edge pulse at its "load" input. When it has counted down to "0", i.e. terminal count, it outputs the TC1 pulse to counter 3 (see counter 606 in FIG. 6). The fpwmx pulse goes high with the leading edge of the Fsw edge pulse and returns to its low level upon the occurrence of the TC1 pulse. As previously noted, the fpwmx signal goes high when the detected and goes low when the leading edge computational period is finished, as indicated by the TC of counter 608.

Counter 2 (see counter 604 in FIG. 6) receives the binary number 19, which is the inverted input (one's complement sum) of 4, the binary number defined by the MSB's on line 607'. When it reaches terminal count, it provides the TC2 pulse to latch 612. The falling edge of TC2 initiates the rising edge of the CPW pulse at output Q of latch 612 (FIG. 6). The previously noted TC1 pulse initiates the down counting of counter 3 (see counter 606 in FIG. 6) which receives the binary number 4, the true value of the MSB's. The trailing edge of TC3 resets latch 612 causing output Q to go down and resulting in the trailing edge of the CPW pulse. The entire CPW pulse is then delayed once (in half cycle delay circuit 704) to produce CPW_d and then again in half cycle delay circuit 710 (FIG. 7) to produce CPW_dd. This results in the interpolation of both the leading and falling edges of the pulses in analog interpolators 740, 742, 744, and 746. Otherwise, as in the single edge modulation case, multiplex circuit 706 provides either CPW or CPW_dd on line 718 for interpolation with CPW_d, depending on the value of the input on line 320, as previously described in connection with the single edge modulation embodiment.

Since in this example, the first pulse period is to have a fine pulse width of 4.33, the one's complement of binary 4, i.e. 19 is routed to the count input of counter 604 on bus 607' and the value of 0.33 is routed to interpolator 610 (all as shown in FIG. 6.

The double edge modulated embodiment of the invention will be better understood in the detailed discussion of the exemplary discussion of the waveforms depicted in FIG. 9. Briefly, for each half of the switching frequency cycle, the controller samples the load voltage, obtains the error voltage, and generates the appropriate pulse width for that half cycle. The compensator output is representative of the desired duty cycle, which is normalized through a multiplier to represent the number of clock cycles from a high frequency clock. In this case, samples alternate between modulating the leading edge and the trailing edge, where the middle of the pulse is always fixed relative to Fsw.

The end result is that the final fine pulse width pulse (FPW) has a width of 4.33+4.85 in one continuous pulse of 9.18 over two PWM clock cycles. This results from interpolating both the leading edges and the trailing edges of the coarse pulses cpw, cpw_d and cpw_dd.

With continued reference to FIG. 9, refer also to FIG. 7 which shows an exemplary implementation of the pulse width generator fine interpolator. It receives the LSBs from the duty cycle and the coarse pulse width, generating the final pulse width by interpolating between CPW and delayed replicas of the CPW. The delayed replicas of CPW are obtained by delaying the CPW waveform through a flip-flop. Inverting the clock allows a half clock period delay to be obtained.

Note that for the first half cycle, the delayed CPW waveform CPW_dd is one clock cycle narrower than CPW, whereas in the second half cycle, it is one clock cycle wider. For the first half cycle, the proper interpolation can be obtained by using the two's complement of the LSBs. This can be easily obtained by simply inverting all the bits, then adding one. The addition by one can be easily accommodated by using the "redundant" LSB available at the fine interpolator. Since one of the weights in one of the stages is unused by the thermometer code, it can simply be set to 1 to accomplish the addition by one. This "redundant" LSB is controlled by the cycle indicator fpwmx. Furthermore, since the symmetric thermometer code is symmetric, there is no difference in whether the inverted or non-inverted input bits are used, so for this embodiment the bit inversion can be eliminated. Finally, since the one's complement and the delay operation resulted in the cpw and cpw_dd being essentially switched, then the multiplex select input also does not require inversion.

For the second half cycle, the interpolation proceeds similarly to the single edge modulation case. This embodiment has all the same linearity and monotonicity advantages listed for the single edge modulation embodiment, with the added advantage of implementing the higher performance double edge modulation.

What has then been described is a structure and method for generating a precise fine pulse width. In one example, the disclosed method includes the steps of generating a coarse pulse width pulse and at least one delayed replica thereof. An interpolation among the coarse pulses under the control of the decoded LSB's provides a precisely interpolated fine pulse width. In the case of single edge modulation, interpolation is with respect to the trailing edges of the coarse pulses. In the case of double edge interpolation, both the leading and trailing edges are interpolated into a single pulse that has a width that is the sum of pulse widths in two consecutive phases.

Figure 10:
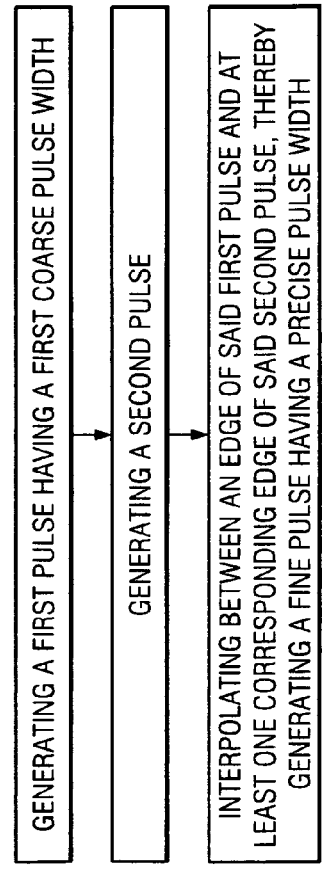
FIG. 10 is a flow chart illustrating a method in accordance with the invention.

As further illustrated in FIG. 10, the disclosed method: 1. generates a first pulse having a first coarse pulse width (e.g. with a counter), 2. generates a second pulse (that typically has at least one edge delayed in time from the first coarse pulse width pulse) and 3. interpolates between the two coarse pulse width pulses (with analog interpolation), thereby generating a fine pulse having a precise pulse width.

The present invention has been described above with reference to various exemplary embodiments. However, those skilled in the art will recognize that changes and modifications may be made to the exemplary embodiments without departing from the spirit and scope of the present invention. Such changes or modifications are intended to be included within the spirit and scope of the present invention, as set forth in the following claims.

What is claimed is:

1. In a pulse-width modulated voltage switching regulator system, a method of generating a train of pulses, each pulse in the train of pulses having a precise pulse width, comprising the steps of:
   generating a first pulse having a leading edge and a trailing edge defining a first coarse pulse width;
   generating a second pulse having a leading edge and a trailing edge, at least one of said edges delayed from the corresponding edge of said first pulse; and
   interpolating between an edge of said first pulse and at least one corresponding edge of said second pulse, thereby generating a fine pulse having a precise pulse width adjustable in increments less than the minimum delay between said at least one of said edges delayed from the corresponding edge of said first pulse.

2. A method as in claim 1, wherein the step of interpolating is performed with an analog interpolator.

3. A method as in claim 1, wherein the width of the fine pulse is specified by a binary number having most significant bits (MSB's) and least significant bits (LSB's).

4. A method as in claim 3, wherein the step of generating the first pulse comprises the steps of:
   receiving a binary number comprising both most significant and least significant bits; and
   counting the number of most significant bits to generate a pulse having a coarse pulse width.

5. A method as in claim 4, wherein the resolution of the fine pulse width is determined by the period of a clock pulse divided by $2^n$ where n is equal to the number of bits that define the least significant bits (LSB's).

6. A method as in claim 4, wherein the interpolation weight is set by the least significant bits (LSB's).

7. A method as in claim 1, further comprising the step of:
   generating a third pulse having a leading edge and a trailing edge, at least one of said edges being delayed from the corresponding edge of said second pulse.

8. A method as in claim 7, wherein said first, second and third pulses have simultaneously occurring leading edges with the second pulse having a trailing edge occurring after the trailing edge of said first pulse and said third pulse having a trailing edge occurring after the trailing edge of said second pulse.

9. A method as in claim 7, wherein the step of generating the third pulse comprises the steps of:
   delaying the second pulse by a fixed time;
   combining the delayed second pulse with said first pulse;
   whereby said third pulse has a leading edge occurring at the same time as said first pulse and a trailing edge that occurs after the trailing edge of said second pulse by said fixed time.

10. A method as in claim 9 wherein said fixed time is half a switching clock cycle.

11. A method as in claim 7, wherein the step of interpolating comprises the step of:
    selecting one of said first and third pulses with one of said least significant bits.

12. A method as in claim 7, wherein said step of interpolating comprises the steps of:
    applying said second pulse and one of said first and third pulses to a first analog interpolator;
    delaying and inverting said second pulse and said one of said first and third pulses and applying said delayed inverted pulses to a second analog interpolator; and
    applying the true output of said first analog interpolator and the complement output of the second analog converter to a differential amplifier which in turn provides a single ended output.

13. A method as in claim 7, wherein the step of interpolating comprises:
    interpolating between the trailing edges of said second pulse and one of said first and third pulses, thereby generating a fine pulse having a precise pulse width.

14. A method as in claim 1, wherein the step of generating the second pulse comprises the steps of:
    delaying the first pulse by a fixed time;
    combining the delayed first pulse with said first pulse;
    whereby said second pulse has a leading edge occurring at the same time as said first pulse and a trailing edge that occurs after the trailing edge of said first pulse by said fixed time.

15. A method as in claim 14, wherein said fixed time is half a switching clock cycle.

16. A fine resolution pulse width modulation pulse generator comprising:
    a first circuit for accepting a binary number, having both most significant bits and least significant bits, said binary number representing the width of a pulse to be generated;
    a second circuit coupled to the output of the first circuit for receiving the most significant bits and generating a coarse pulse width pulse based on the numeric value of the most significant bits;
    delay circuitry coupled to the output of the second circuit for receiving said coarse pulse width pulse and providing first and second delayed coarse pulse width pulses;

a circuit for selecting either said coarse pulse width pulse or said second delayed coarse pulse width pulse to apply to a first input of an analog interpolator;

an output of said delay circuitry coupled to a second input of said analog interpolator;

an encoding circuit for coupling at least some of the least significant bits to said analog interpolator;

whereby the analog interpolator produces a fine pulse width pulse having a pulse width that is interpolated between the width of the pulses at the first and second inputs of said analog interpolator in increments not limited to the minimum delay in said delay circuitry.

17. A pulse width modulation pulse generator as in claim 16, wherein said first circuit comprises:

a multiplier circuit for receiving a binary number representing the duty cycle of the fine pulse width pulse to be generated and multiplying it by a number representing a 100% duty cycle.

18. A pulse width modulation pulse generator as in claim 16, wherein the second circuit comprises:

a counter configured to determine the value of the most significant bits; and a latch circuit for generating a coarse pulse width pulse based on the numeric value of the most significant bits.

19. A pulse width modulation pulse generator as in claim 16, wherein double edge modulation is used and the second circuit comprises:

a plurality of counters configured to determine the value of the most significant bits; and a latch circuit for generating a coarse pulse width pulse based on the numeric value of the most significant bits.

20. A pulse width modulation pulse generator as in claim 16, wherein the delay circuitry comprises:

a first delay circuit coupled to the output of the second circuit for receiving said coarse pulse width pulse and providing a first delayed coarse pulse width pulse; and a second delay circuit for providing a second delayed coarse pulse width pulse.

21. A pulse width modulation pulse generator as in claim 20, wherein the second delay circuit provides a second delayed coarse pulse width pulse (CPW_dd) that is time delayed from the coarse pulse width pulse (CPW) by double the time delay of the first delayed coarse pulse width pulse as measured from the first coarse pulse width pulse (CPW).

22. A pulse width modulation pulse generator as in claim 16, comprising:

additional analog interpolators coupled to the first delay circuit and said multiplexing circuit by means of inverting delay circuits; and a differential to single ended amplifier coupled to the outputs of the plurality of analog interpolators.

23. A pulse width modulation pulse generator as in claim 16, wherein said analog interpolator comprises:

CMOS transistors having width to length ratios tailored to provide inherent resistance values for desired rise and fall times.

24. A pulse width modulation pulse generator as in claim 16, wherein said analog interpolator comprises:

a plurality of series connected CMOS transistors having at least some of their control electrodes coupled to the output of said encoding circuit.

25. A pulse width modulation pulse generator as in claim 24, comprising;

a plurality of said plurality of series connected CMOS transistors connected in parallel and forming a common output.

26. A pulse width modulation pulse generator as in claim 25, further comprising:

a resistive current limiter coupled in series between said plurality of series connected CMOS transistors and a potential source.

27. A pulse width modulation pulse generator as in claim 26, comprising;

a plurality of said plurality of series connected CMOS transistors connected in parallel and forming a common output.

28. A pulse width modulation pulse generator as in claim 16, wherein said encoding circuit comprises:

a thermometer encoder.

29. A pulse width modulation pulse generator as in claim 16, wherein said circuit for selecting either said coarse pulse width pulse or said second delayed coarse pulse width pulse is a multiplexer circuit.

30. A pulse width modulation pulse generator as in claim 29, wherein said analog interpolator comprises:

a plurality of legs coupled in parallel between first and second potential sources, each leg comprising four transistors and one of said legs comprising:

a control electrode of first and second of said four transistors being coupled to said encoding circuit; and a control electrode of a third and fourth one of said four transistors being coupled to said multiplexing circuit.

31. A pulse width modulation pulse generator as in claim 30, wherein another one of said legs comprises:

a control electrode of first and second of said four transistors being coupled to said encoding circuit; and a control electrode of the third and fourth one of said four transistors being coupled to said delay circuitry.

32. A pulse width modulation pulse generator as in claim 30, wherein said multiplexing circuit is configured to provide a signal to the control electrode of the third one of said four transistors, said signal being either said coarse pulse width pulse or said second delayed coarse pulse width pulse.

33. A pulse width modulation pulse generator as in claim 16, further comprising:

additional analog interpolators coupled to the first delay circuit and said multiplexing circuit by means of inverting delay circuits;

each of said analog interpolators having a plurality of series connected CMOS transistors coupled between high and low potential sources and having at least some of their control electrodes coupled to the output of said encoding circuit; and a resistive current limiter in only one of said analog interpolators coupled in series between said plurality of series connected CMOS transistors and at least one of said potential sources in each of said analog interpolators.

34. A pulse width modulation pulse generator comprising:

a counter for receiving the most significant bits of a binary word and configured to provide a signal to generate a first coarse pulse width pulse; and a fine interpolator coupled to the counter for receiving said first coarse pulse width pulse and for receiving least significant bits of said binary word;

said fine interpolator configured to interpolate between said first coarse pulse width pulse and a second coarse pulse width pulse to generate a fine pulse having a precise pulse width;

wherein the precise pulse width is adjustable in increments less than the minimum delay occurring between said first coarse pulse width pulse and said second coarse pulse width pulse.

35. A pulse width modulation pulse generator as in claim 34 wherein said fine interpolator comprises:

an analog interpolator.

36. A pulse width modulation pulse generator as in claim 35, further comprising:

a circuit for coupling said counter to said fine interpolator.

37. A pulse width modulation pulse generator as in claim 36, wherein said circuit for coupling said counter to said fine interpolator comprises:

a latch.

38. A pulse width modulation pulse generator as in claim 34, further comprising:

a thermometer encoder coupled to the input of the fine interpolator for encoding the least significant bits supplied to the fine interpolator.

* * * * *